(12) United States Patent
Kawai et al.

(10) Patent No.: US 8,188,380 B2
(45) Date of Patent: May 29, 2012

(54) PRINTED WIRING BOARD AND METHOD FOR MANUFACTURING PRINTED WIRING BOARD

(75) Inventors: Satoru Kawai, Ogaki (JP); Kenji Sakai, Gifu (JP); Liyi Chen, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 238 days.

(21) Appl. No.: 12/610,526

(22) Filed: Nov. 2, 2009

(65) Prior Publication Data
US 2010/0163293 A1 Jul. 1, 2010

Related U.S. Application Data

(60) Provisional application No. 61/141,137, filed on Dec. 29, 2008.

(51) Int. Cl.
*H01L 29/40* (2006.01)
*H01L 29/47* (2006.01)

(52) U.S. Cl. ........ 174/262; 174/254; 174/255; 174/260; 257/737; 257/678; 257/774; 438/618; 438/631; 438/645; 361/760; 361/765; 361/792; 361/795

(58) Field of Classification Search .......... 174/254–262; 361/732, 748, 760–767, 780–798; 257/621, 257/686, E23.119, 698, 752, 753, 764, 762, 257/780, 700, 774, 776, E21.508, E23.021; 438/672–675, 687, 613–618, 622, 666, 631, 438/645, 669, 634–640
See application file for complete search history.

(56) References Cited

U.S. PATENT DOCUMENTS

| | | | |
|---|---|---|---|
| 6,261,941 B1 * | 7/2001 | Li et al. | 438/618 |
| 6,365,843 B1 * | 4/2002 | Shirai et al. | 174/262 |
| 6,392,898 B1 * | 5/2002 | Asai et al. | 361/794 |
| 6,909,054 B2 * | 6/2005 | Sakamoto et al. | 174/260 |
| 6,940,179 B2 * | 9/2005 | Lee | 257/780 |
| 7,129,158 B2 * | 10/2006 | Nakai | 438/613 |

(Continued)

FOREIGN PATENT DOCUMENTS
JP 2000-323613 11/2000

OTHER PUBLICATIONS
U.S. Appl. No. 12/606,546, filed Oct. 27, 2009, Kawai, et al.

*Primary Examiner* — Michail V Datskovskiy
(74) *Attorney, Agent, or Firm* — Oblon, Spivak, McClelland, Maier & Neustadt, L.L.P.

(57) ABSTRACT

A printed wiring board and a method for manufacturing the same are provided. The printed wiring board includes a resin insulation layer having a first surface and a second surface opposite the first surface, and includes an opening for a first via conductor. An electronic-component mounting pad is formed on the first surface of the resin insulation layer. The electronic-component mounting pad includes a portion embedded in the resin insulation layer and a portion protruding from the resin insulation layer. The protruding portion covers the embedded portion and a portion of the first surface of the resin insulation layer that surrounds the embedded portion. A first conductive circuit is formed on the second surface of the resin insulation layer. A first via conductor is formed in the opening of the resin insulation layer and connects the electronic-component mounting pad and the first conductive circuit.

10 Claims, 20 Drawing Sheets

U.S. PATENT DOCUMENTS

| | | | |
|---|---|---|---|
| 7,190,078 B2 * | 3/2007 | Khandekar et al. | 257/774 |
| 7,294,929 B2 * | 11/2007 | Miyazaki | 257/737 |
| 7,307,852 B2 * | 12/2007 | Inagaki et al. | 361/760 |
| 7,371,974 B2 * | 5/2008 | Toyoda et al. | 174/262 |
| 7,378,602 B2 * | 5/2008 | Ikeda | 174/262 |
| 7,423,219 B2 * | 9/2008 | Kawaguchi et al. | 174/254 |
| 7,449,781 B2 * | 11/2008 | Nakai | 257/762 |

* cited by examiner

FIG. 1
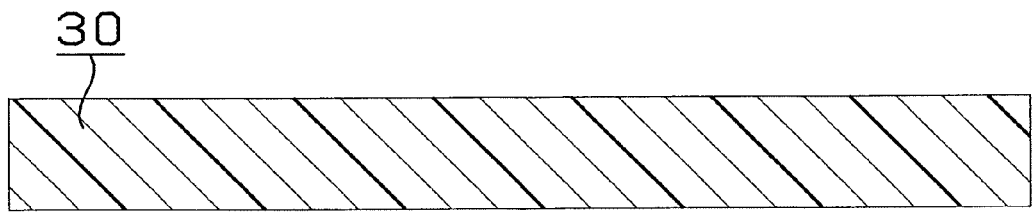
(A)
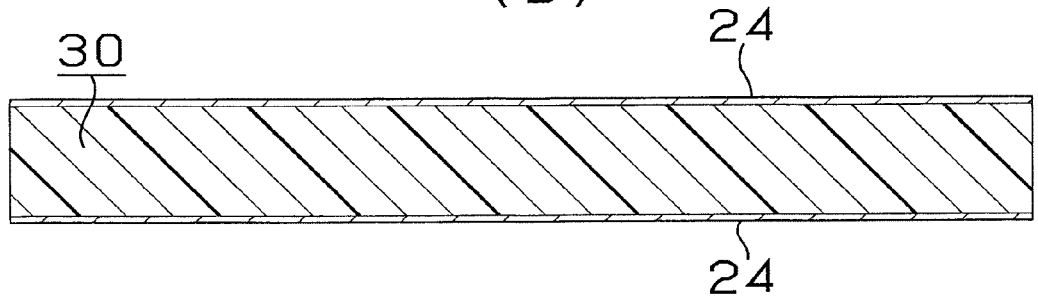
(B)
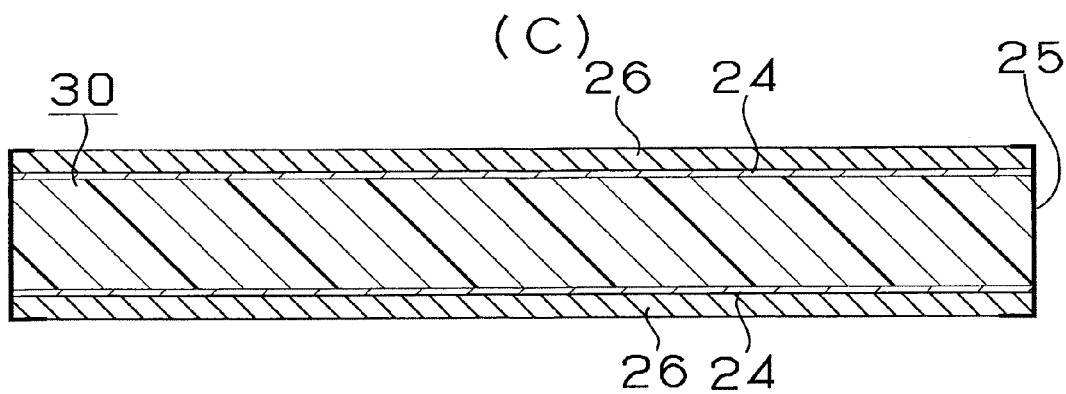
(C)
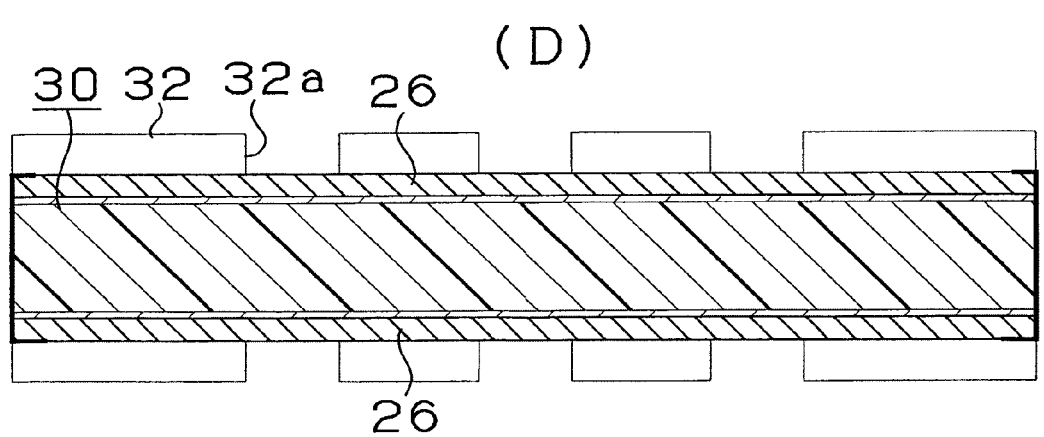
(D)

FIG. 3
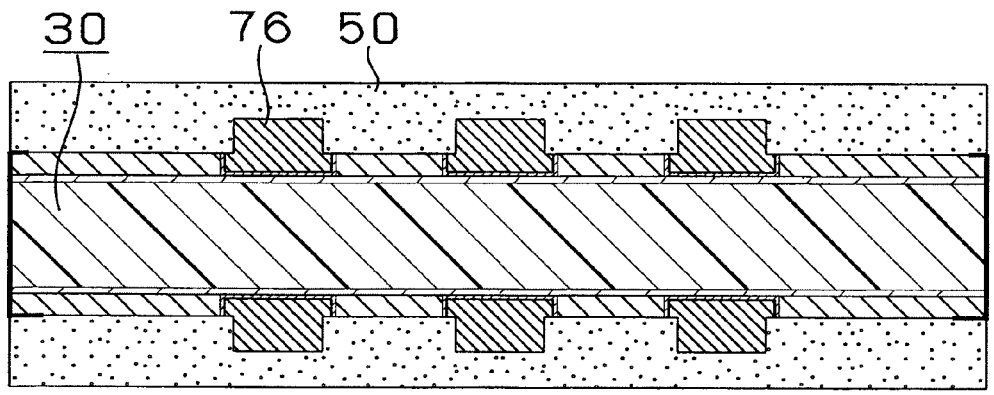
(A)
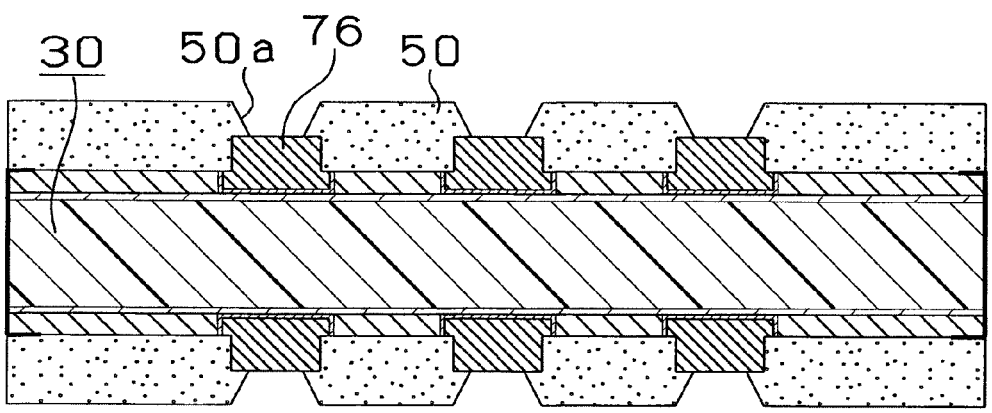
(B)
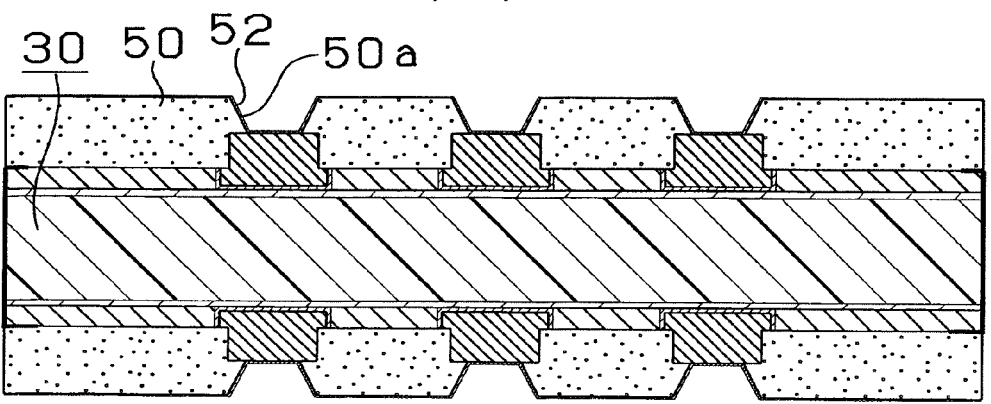
(C)

FIG. 4
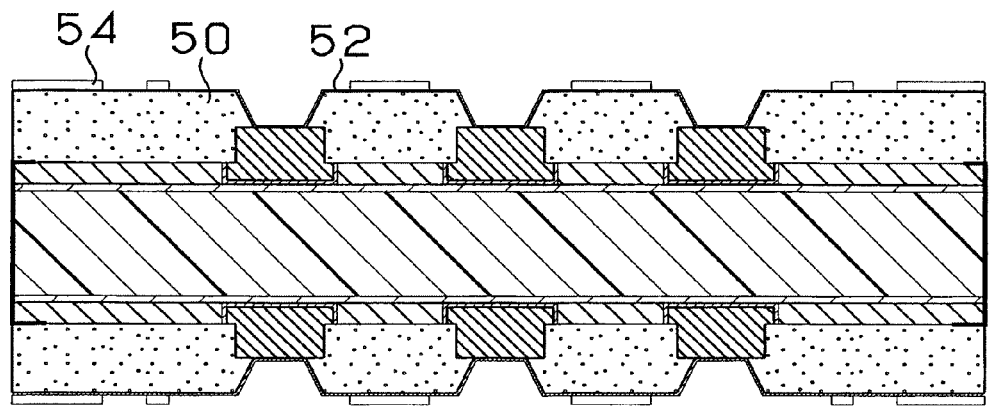
(A)
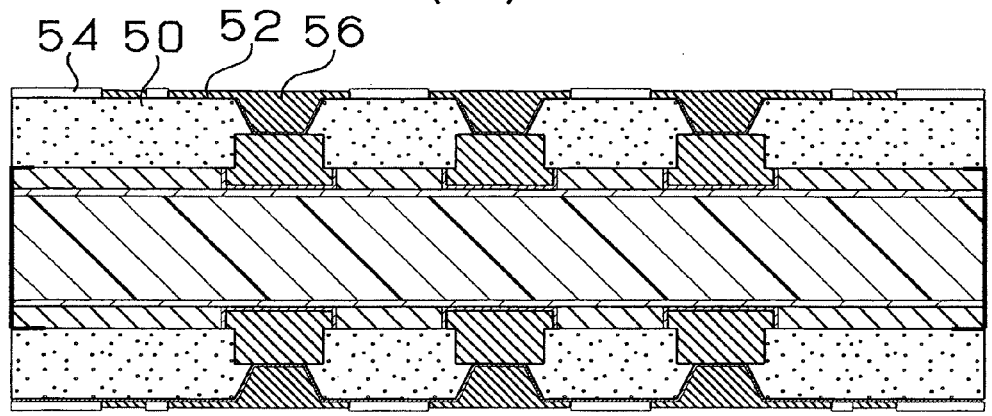
(B)
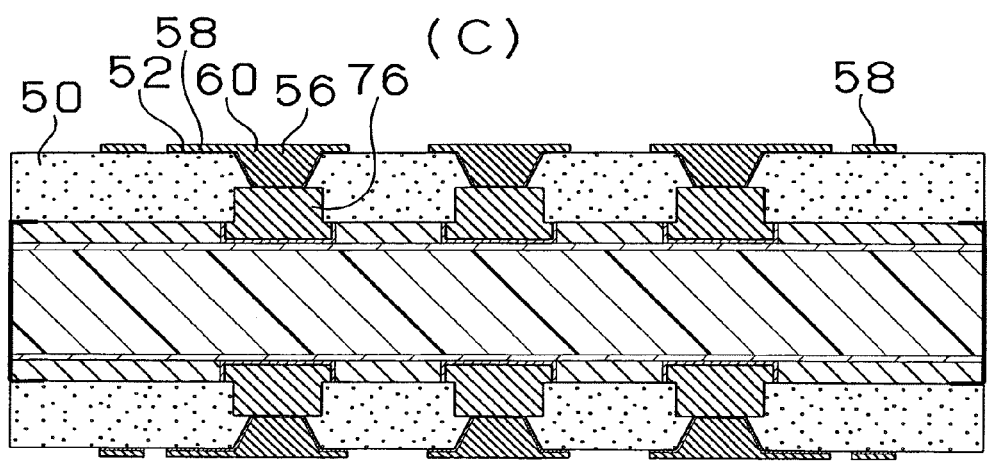
(C)

FIG. 10
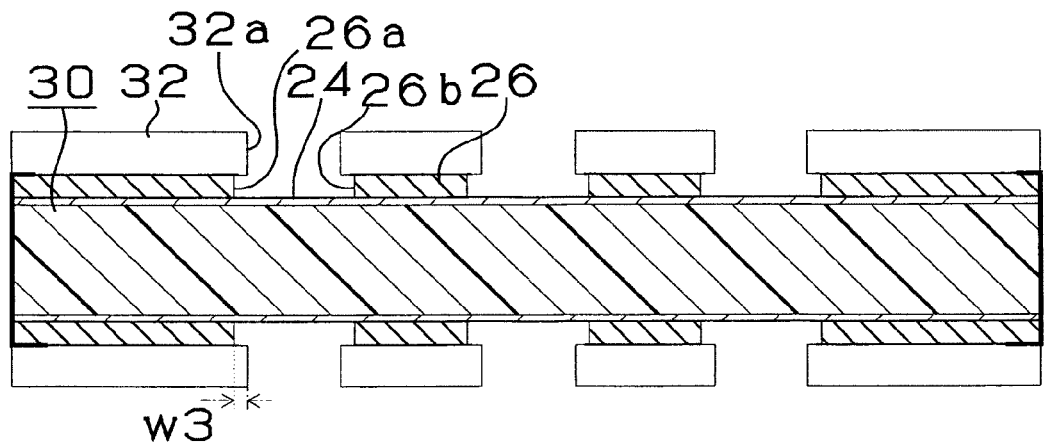
(A)
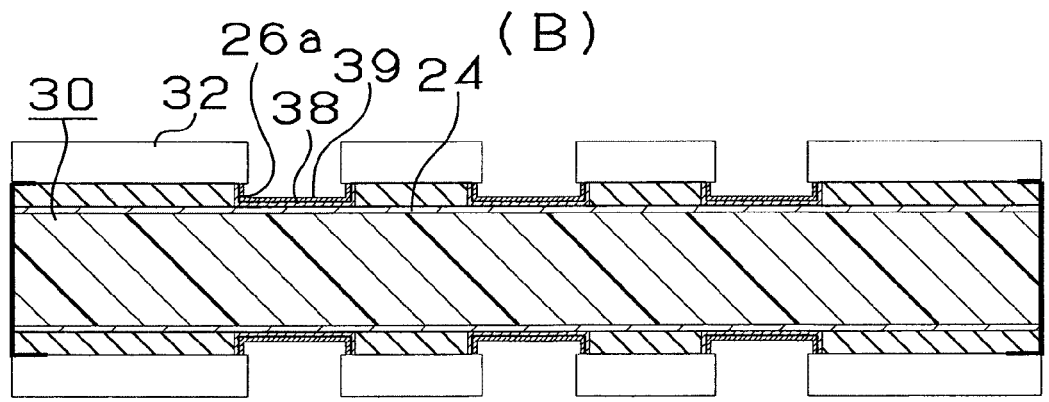
(B)
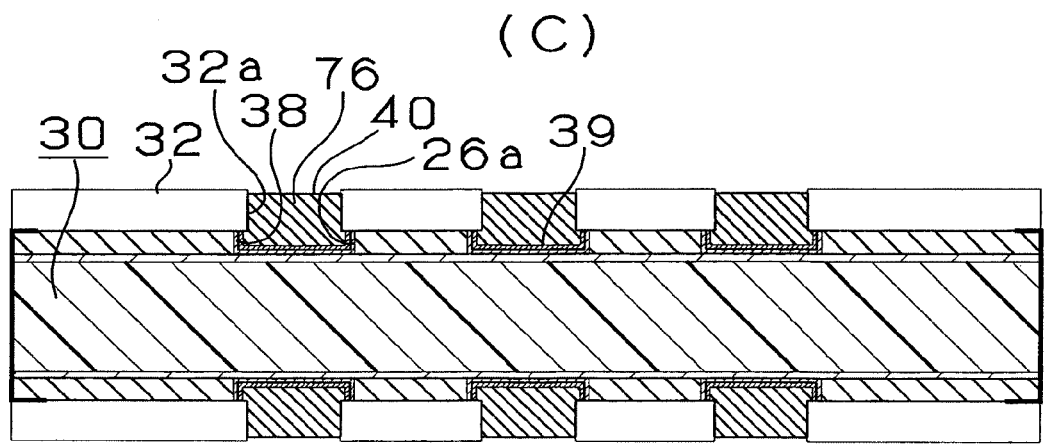
(C)

FIG. 14
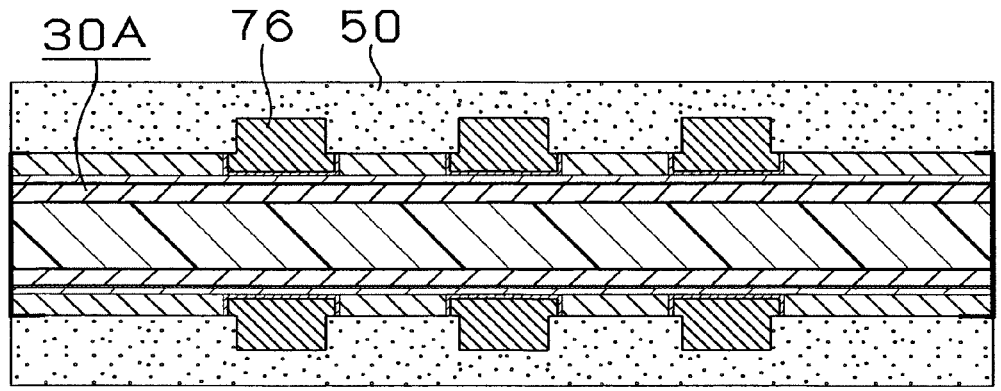
(A)
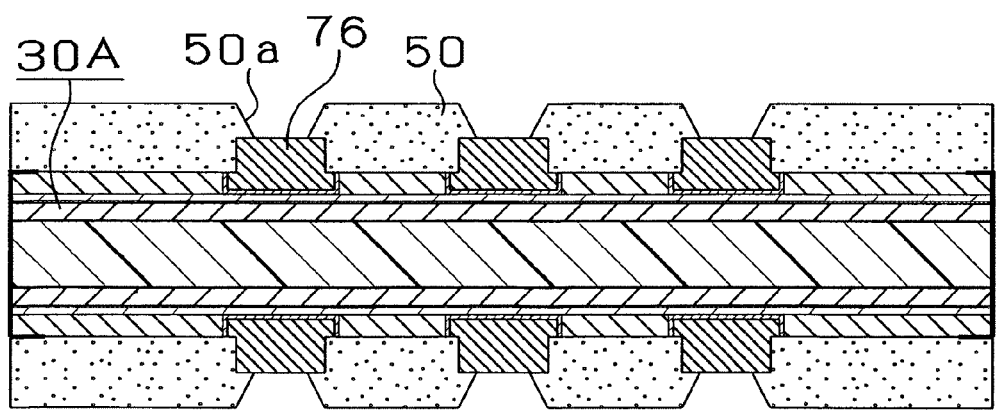
(B)
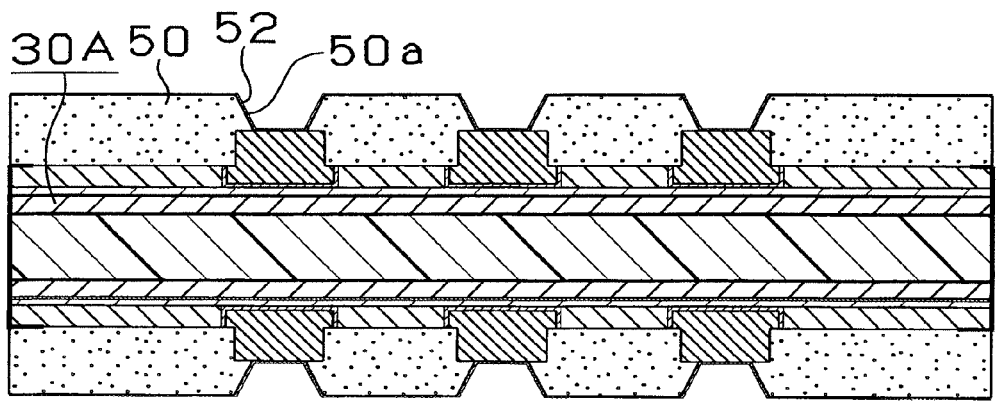
(C)

FIG. 15
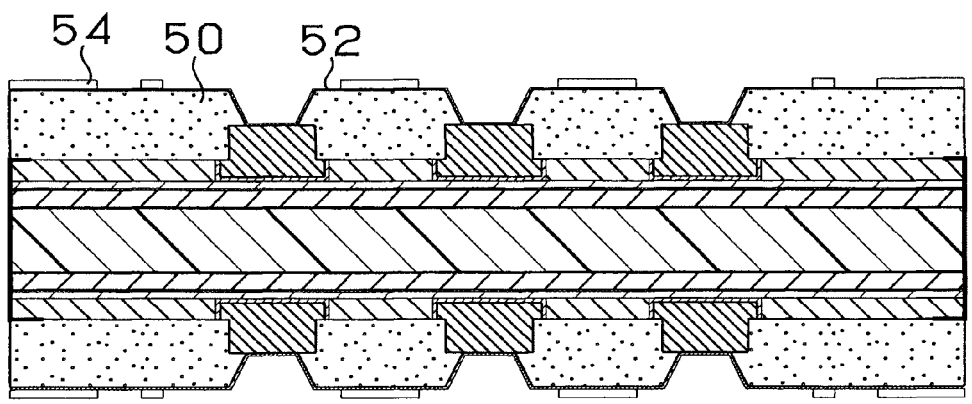
(A)
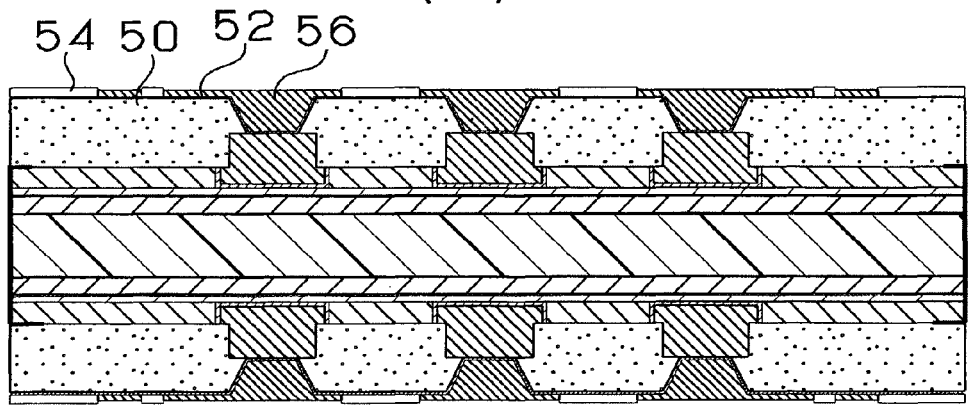
(B)
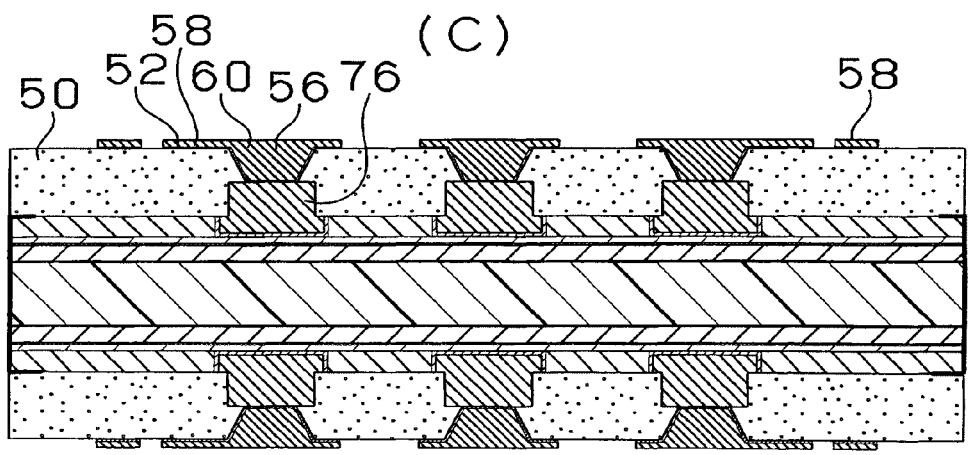
(C)

PAD-FORMING REGION

PRINTED WIRING BOARD AND METHOD FOR MANUFACTURING PRINTED WIRING BOARD

CROSS-REFERENCE TO RELATED APPLICATIONS

The present application claims the benefits of priority to U.S. Application No. 61/141,137, filed Dec. 29, 2008. The contents of that application are incorporated herein by reference in their entirety.

BACKGROUND OF THE INVENTION

1. Field of the Invention

The present invention is related to a printed wiring board having a pad, which is formed on the upper-surface side of a resin insulation layer, for mounting an electronic component such as a semiconductor element; a conductive circuit (including an external connection terminal), which is formed on the lower-surface side of the resin insulation layer, for connection with an external substrate; and a via conductor, which is formed in the resin insulation layer, for connecting the pad and the external connection terminal. The present invention is also related to a method for manufacturing such a printed wiring board.

2. Discussion of the Background

Japanese Laid-Open Patent Publication 2000-323613 (Patent Publication (1)) discloses a printed wiring board (multilayer substrate) which is formed without using a core substrate by laminating resin insulation layers and conductive layers alternately. In the multilayer substrate of Patent Publication (1), pads for a semiconductor element are formed on the upper-surface side, and pads for external connection terminals are formed on the lower-surface side. The pads for a semiconductor element are embedded in the outermost insulation layer of the upper-surface side. The surfaces of the pads for a semiconductor element are positioned at the same level as the surface of the outermost layer, or lower than the surface of the outermost layer. On the other hand, the pads for external connection terminals are formed on the outermost insulation layer on the lower-surface side.

The contents of Japanese Laid-Open Patent Publication 2000-323613 are incorporated herein by reference in their entirety.

SUMMARY OF THE INVENTION

In an exemplary aspect, a printed wiring board is provided. The printed wiring board includes a resin insulation layer having a first surface and a second surface opposite the first surface, and includes an opening for a first via conductor. An electronic-component mounting pad is formed on the first surface of the resin insulation layer. The electronic-component mounting pad includes a portion embedded in the resin insulation layer and a portion protruding from the resin insulation layer. The protruding portion covers the embedded portion and a portion of the first surface of the resin insulation layer that surrounds the embedded portion. A first conductive circuit is formed on the second surface of the resin insulation layer. A first via conductor is formed in the opening of the resin insulation layer and connects the electronic-component mounting pad and the first conductive circuit.

In another exemplary aspect, a method for manufacturing a printed wiring board is provided. The method includes preparing a carrier and forming a metal layer on the carrier. An etching resist is formed on the metal layer. A metal film from the metal layer underneath the etching resist is formed by removing a portion of the metal layer exposed through the etching resist and part of the metal layer which is contiguous to the exposed portion of the metal layer and is formed underneath the etching resist. A coating layer is formed on a side surface of the metal film and the carrier. A pad having a first surface and a second surface opposite the first surface is formed on the coating layer. The etching resist is removed. A resin insulation layer having a first surface and a second surface opposite the first surface is formed on the metal film and the second surface of the pad. A first opening reaching the second surface of the pad is formed in the resin insulation layer. A first conductive circuit is formed on the second surface of the resin insulation layer. A first via conductor connecting the first conductive circuit and the pad is formed in the first opening. The carrier from the metal film and the coating layer is removed, and the metal film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A-1D are views showing the steps of a method for manufacturing a multilayer printed wiring board according to the First Example Embodiment of the present invention;

FIGS. 3A-3C are views showing the steps of a method for manufacturing a multilayer printed wiring board according to the First Example Embodiment;

FIGS. 4A-4C are views showing the steps of a method for manufacturing a multilayer printed wiring board according to the First Example Embodiment;

FIGS. 10A-10C are views showing the steps of a method for manufacturing a multilayer printed wiring board according to the Second Example Embodiment of the present invention;

FIGS. 14A-14C are views showing the steps of a method for manufacturing a multilayer printed wiring board according to the First Example;

FIGS. 15A-15C are views showing the steps of a method for manufacturing a multilayer printed wiring board according to the First Example;

DETAILED DESCRIPTION OF THE EMBODIMENTS

Figure 2:
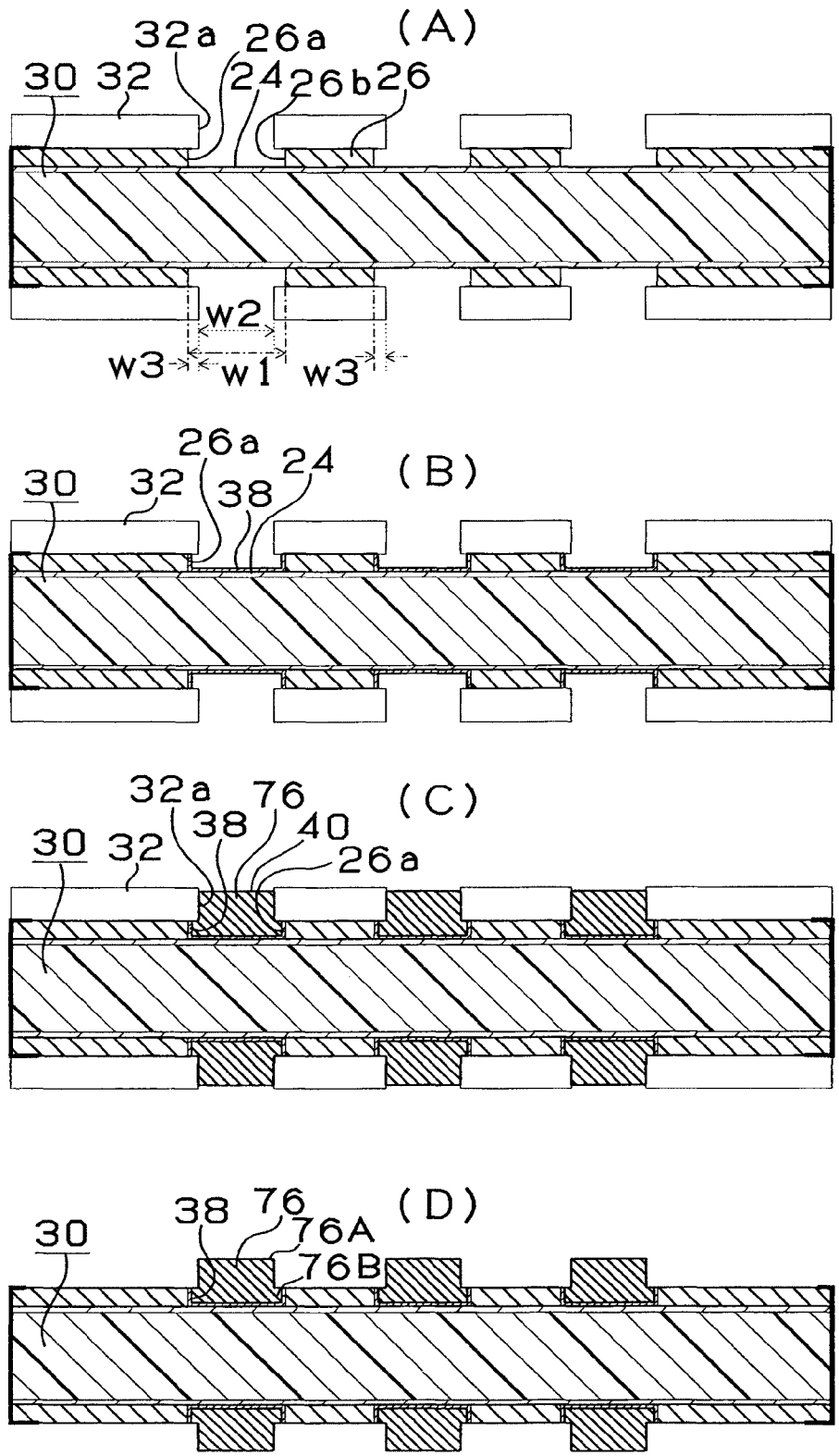
FIGS. 2A-2D are views showing the steps of a method for manufacturing a multilayer printed wiring board according to the First Example Embodiment.

The embodiments will now be described with reference to the accompanying drawings, wherein like reference numerals designate corresponding or identical elements throughout the various drawings.

In the multilayer substrate of Japanese Laid-Open Patent Publication 2000-323613, pads for mounting a semiconductor element are embedded in the outermost insulation layer of the upper-surface side. On the other hand, pads for external connection terminals are formed on the outermost insulation layer of the lower-surface side. Accordingly, it is thought that the percentage of the surface of the resin insulation layer covered by conductor made of metal differs on the upper-surface side from that on the lower-surface side. Also, since the multilayer substrate does not have a core substrate as its core, its rigidity is thought to be low. Accordingly, it is thought that the multilayer substrate may tend to warp, undulate or bend. Therefore, if a semiconductor element is flip-chip mounted on the multilayer substrate, it is thought that the pads of the multilayer substrate and the electrodes of the semiconductor element may tend to become disconnected.

Furthermore, if a printed wiring board warps, its resin insulation layer bends. However, since pads made of metal are highly rigid, it is thought that the pads may seldom bend. Thus, it is thought that stress may concentrate in areas between the side surfaces of the pads for a semiconductor element and the outermost resin insulation layer touching that side surface. Thus, if the printed wiring board warps many times during heat cycle testing or the like, peeling may easily occur in the areas between the side surfaces of the pads for a semiconductor element and the outermost resin insulation layer touching such side surfaces. Accordingly, it is forecast that cracks originating in the peeling spots will occur in the outermost resin insulation layer. In addition, it is thought that conductive circuits may break due to such cracks.

The present invention was carried out to solve such problems. Its objectives are to provide a printed wiring board in which cracks seldom occur in resin insulation layers and a manufacturing method for such a printed wiring board. To achieve the above objectives, a printed wiring board of the present invention is formed by a resin insulation layer having a first surface and a second surface opposite the first surface, and having an opening for a first via conductor; an electronic-component mounting pad formed on the first-surface side of the resin insulation layer; a first conductive circuit formed on the second-surface side of the resin insulation layer; a first via conductor formed in the opening of the resin insulation layer and connecting the pad and the first conductive circuit. In such a printed wiring board, the pad is made up of a portion embedded in the resin insulation layer and a portion protruding from the resin insulation layer, and the protruding portion covers the embedded portion and the surface of the resin insulation layer surrounding the embedded portion.

In an embodiment of the present invention, a pad is made up of a portion embedded in a resin insulation layer (embedded portion) and of a portion protruding from the resin insulation layer (protruding portion). The protruding portion of a pad covers the first surface of the resin insulation layer surrounding the embedded portion. Namely, in addition to highly rigid pads touching the resin insulation layer on their side surfaces, the protruding portions make contact with the first surface of the resin insulation layer surrounding the embedded portions. Therefore, even if a printed wiring board warps during heat cycle testing, since the contact area between pads and the resin insulation layer is large, stress may be dispersed. In an embodiment of the present invention, cracks seldom occur in the resin insulation layer. Moreover, occurrence of breakage in conductive circuits due to cracks in the resin insulation layer decreases, and the reliability of the printed wiring board increases. In addition, since pads have protruding portions covering the first surface of the resin insulation layer, areas covered by conductor increases in the first surface of the resin insulation layer. Thus, the difference decreases between the area on the first surface of the resin insulation layer covered by conductor and the area on the second surface (lower surface) of a resin insulation layer covered by conductor. Accordingly, since the difference in the degree of deformation decreases between the first surface (upper surface) and the second surface (lower surface) during heat cycle testing, the printed wiring board may tend to warp to a lesser degree. As a result, it is thought that performance when mounting an IC chip will improve, and connection reliability between the IC chip and the printed wiring board will also improve. Furthermore, a larger-size IC chip may be mounted.

Figure 6:
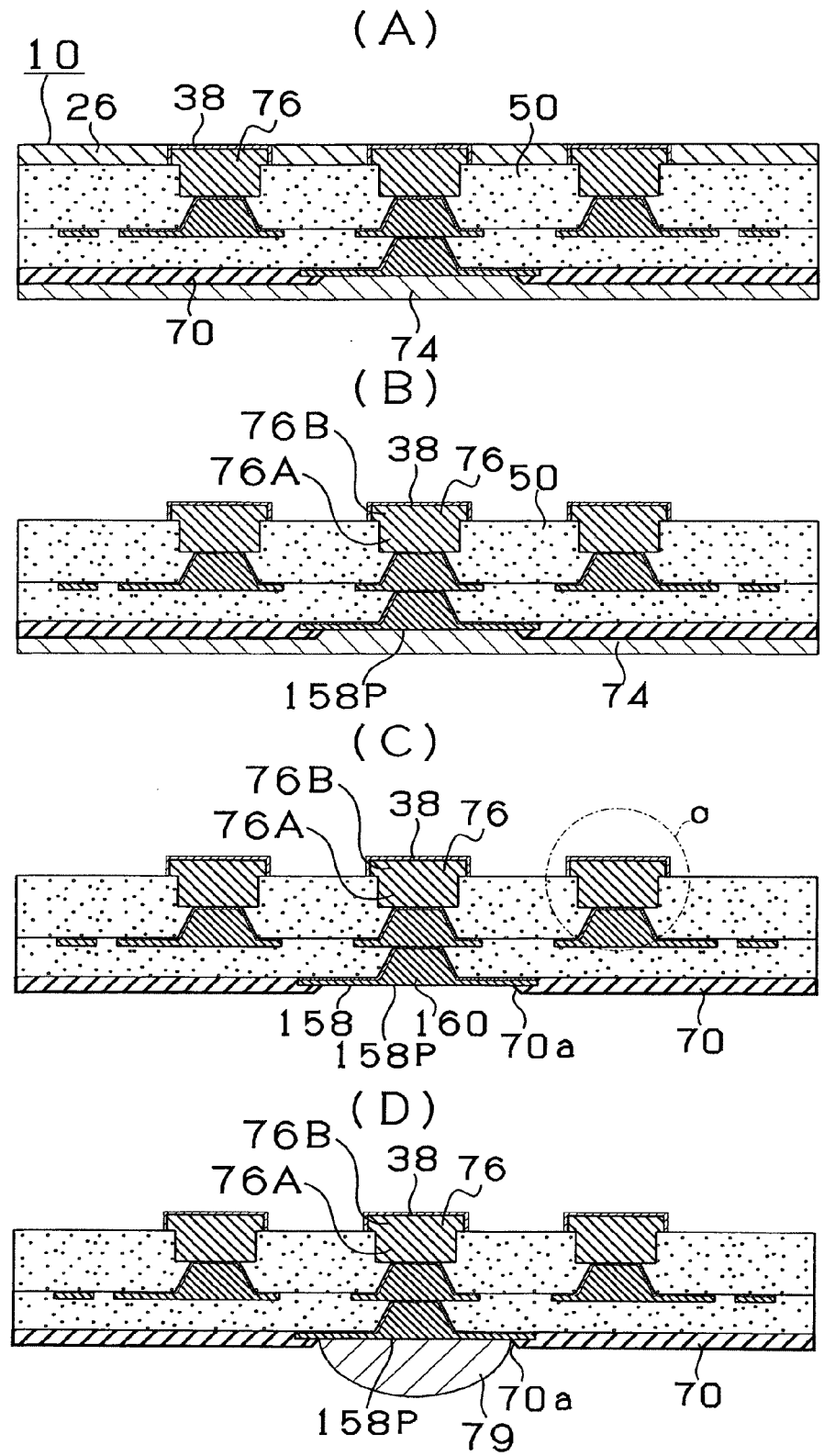
FIGS. 6A-6D are views showing the steps of a method for manufacturing a multilayer printed wiring board according to the First Example Embodiment.

First, the structure of multilayer printed wiring board (10) according to the First Embodiment of the present invention is described with reference to FIGS. (1)-(8). FIG. 6(C) is a cross-sectional view of multilayer printed wiring board (10), and FIG. (8) shows a state in which IC chip (90) is mounted on multilayer printed wiring board (10) shown in FIG. 6(C), which is then mounted on motherboard (94). On its upper-surface side, multilayer printed wiring board (10) has pads (76) for mounting electronic components such as IC chip (90), and on its lower-surface side, it has pads (external connection terminals) (158P) for connection with motherboard (94). Pad (76) on the upper-surface side is a conductor for mounting an electronic component such as an IC chip, and is made up of a portion (embedded portion) (76A) which is embedded in resin insulation layer (50) and of a portion (protruding portion) (76B) which protrudes from resin insulation layer (50). Protruding portion (76B) is covered by coating layer (38). The coating layer is preferred to be made of plated film, and the coating layer of the First Embodiment is tin-plated film. On tin-plated film (38), solder bump (78) is formed. Then, electrode (92) of an electronic component, for example, IC chip (90), and the pad are connected by means of solder bump (78). On the other hand, external connection terminal (158P) on the lower-surface side is formed on the surface of the lowermost resin insulation layer (lower resin insulation layer) (150), and the periphery of the external connection terminal is covered by solder resist (70). Namely, part of conductive circuit (158) or via conductor exposed through opening (70a) of solder resist (70) forms external connection terminal (158P). Pad (158P) is connected to land

Figure 20:
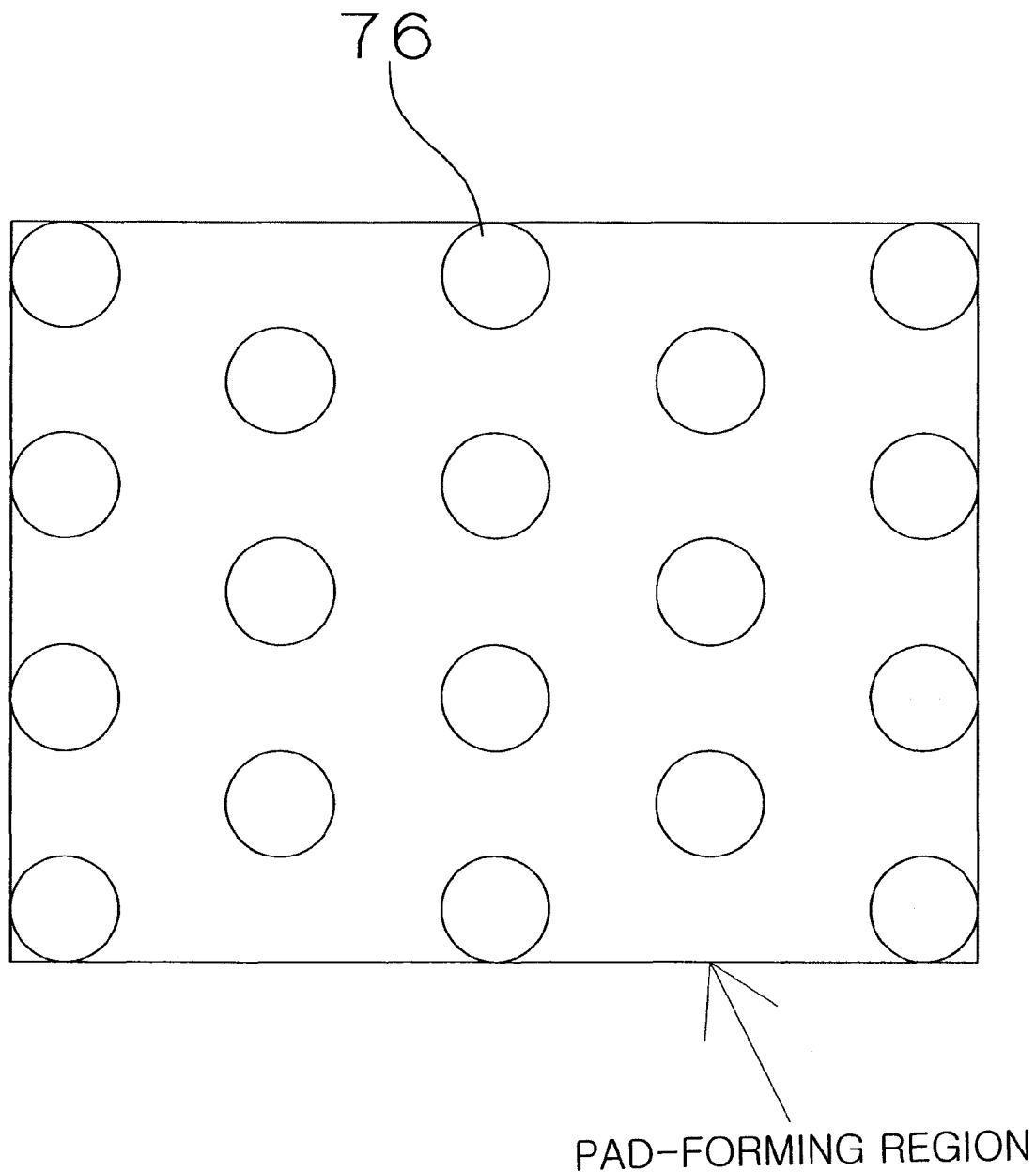
FIG. 20 is a plan view of the pad-forming region according to the Example Embodiments.

(96) of motherboard (94) by means of solder bump (79) formed on pad (158P). Pads (76) are formed in the pad-forming region (FIG. 20). The pad-forming region is configured to be rectangular, which has the smallest possible area to include all the pads. Except for the pad-forming region, the first surface of the resin insulation layer is preferred to be exposed. Namely, except for the pad-forming region, it is preferred that conductive circuits not be formed on the first surface of the resin insulation layer.

Pad (76) for connection with an IC chip on the upper-surface side and pad (158P) for connection with a motherboard on the lower-surface side are connected by means of via conductor (60) formed in resin insulation layer (50), conductive circuit (58) on resin insulation layer (50), via conductor (160) formed in resin insulation layer (150) and conductive circuit (158) formed on resin insulation layer (150).

FIG. (9) is a magnified view of pad (76) in circle "C" shown in FIG. 6(C). In multilayer printed wiring board (10) of the First Embodiment, pad (76) on the upper-surface side is made up of embedded portion (76A) and protruding portion (76B). Diameter (D1) of embedded portion (76A) is smaller than diameter (D2) of protruding portion (76B). The protruding portion covers the embedded portion, and the protruding portion and the embedded portion are directly connected. Also, part of protruding portion (76B) not covering the embedded portion covers the upper surface of resin insulation layer (50) surrounding embedded portion (76A). Namely, in addition to the embedded portion of highly rigid pad (76) touching resin insulation layer (50) on its side surfaces, part of protruding portion (76B) not directly touching the embedded portion makes contact with the upper surface (first surface) of resin insulation layer (50) surrounding embedded portion (76A).

Multilayer printed wiring board (10) according to the First Embodiment is formed with resin insulation layer (50) and lower resin insulation layer (150). The resin insulation layers (including the lower resin insulation layer) are made from resin and inorganic particles. As for inorganic particles, silica, alumina, barium sulfate, magnesium oxide or the like may be listed. Thus, multilayer printed wiring board (10) of the First Embodiment tends to warp during heat cycle testing. However, in the multilayer printed wiring board of the First Embodiment, in addition to pads (76), which are highly rigid and whose side surfaces touch the resin insulation layer, protruding portions (76B) make contact with the upper surface of resin insulation layer (50) surrounding embedded portions (76A). Accordingly, even if the printed wiring board warps during heat cycle testing, such stress may be easily dispersed since the contact area between pads (76) and resin insulation layer (50) is large. As a result, the printed wiring board of the First Embodiment seldom has cracks in resin insulation layer (50). The amount ((D2−D1)/2) that the protruding portion covers the first surface of the resin insulation layer is preferred to be in the range of 2 μm-15 μm. If the amount is in such a range, finer and more reliable features may be both achieved. The resin insulation layers of the First Embodiment do not contain core material such as glass fabric, but resin insulation layers with core material may be used to suppress warping. Especially, if the number of resin insulation layers is three or fewer, one of the layers is preferred to be such resin insulation layer made of inorganic particles, core and resin. If the number of resin insulation layers is four or more, it is preferred that all the resin insulation layers be made without core material, but be such as those made of inorganic particles and resin. The core material is glass cloth, glass non-woven fabric, aramid non-woven fabric or the like. Among those, glass cloth is preferred.

In the printed wiring board of the First Embodiment, coating layer (38) is formed on the surfaces of protruding portions (76B). In the present embodiment, tin-plated film (electrolytic tin-plated film) (38) is formed as the coating layer. Thus, the surfaces of the protruding portions will not be oxidized, and the connection reliability with solder bumps is high. Also, when reflowing the solder bumps, since tin-plated film (38) will fuse into the solder side, connection reliability of the solder bumps will be high. In addition, such a coating layer may be formed inexpensively and easily, compared with a nickel-gold layer or the like formed as a coating layer.

In the following, a method for manufacturing multilayer printed wiring board (10) described above with reference to FIG. 6(C) is described by referring to FIGS. (1)-(6).

(1) Carrier (30) with a thickness of 10-500 μm is prepared (FIG. 1(A)). As for a carrier, nickel foil, aluminum foil, copper foil, nickel-alloy foil or copper-alloy foil may be used. Other than those, metal plates made of nickel, copper or aluminum may be used. Alternatively, substrates with a conductive metal layer formed on the surfaces may also be used as a carrier. As for an example of such substrates, a copper-clad laminate is shown. Removable layer (24) is formed on the carrier (FIG. 1(B)). Removable layer (24) is a removable metallic layer made of nickel, chrome or the like, or a removable carbon layer. A removable carbon layer may be formed by vacuum deposition or sputtering, and its thickness is preferred to be set at 1-20 nm. A removable carbon layer may be formed by sputtering using a carbon target material. Otherwise, organic removable layers made of carboxy benzotriazole (CBTA), N',N'-bis (benzotriazole methyl) urea (BTD-U) and 3-amino-1H-1,2,4-triazole (ATA) or the like may be listed.

(2) Metal layer (26) is formed on the removable layer (FIG. 1(C)). The metal layer is made of metal foil or plated film with a thickness of 3-50 μm. As for such metal foil, copper foil, nickel foil, nickel-alloy foil or copper-alloy foil may be used. The metal film is electroless plated film or electrolytic plated film made of copper, nickel, solder or the like. In the First Embodiment, copper foil with a thickness of 18 μm is formed on the nickel foil with a thickness of 200 μm by means of a removable layer made of a nickel-chrome alloy. Since metal foil has a uniform thickness, metal foil is preferred to be used as a metal layer. The carrier and the metal layer are preferred to be fixed using adhesive (25) at their end surfaces. Etching resist (32) with a thickness of 15 μm and having openings (32a) is formed on the metal layer (FIG. 1(D)). Etching is performed using an iron chloride etchant to remove the metal layer exposed through openings (32a) of etching resist (32). Part of the metal layer located under the etching resist and contiguous to the metal layer exposed through openings (32a) is removed at the same time (FIG. 2(A)). In doing so, metal film (26a) is formed under the etching resist. Opening diameter (w2) of the etching resist is smaller than diameter (w1) of opening (26b) of the metal film (w1>w2). The opening diameter of the metal film equals the diameter of the hollow section formed directly under the etching resist and the distance between the adjacent sides of the metal film (see FIG. 2(A)). The length (w3) to be removed from the metal layer located under the etching resist is preferred to be in the range of 1 μm to 20 μm. If the length is in such a range, finer and reliable features will be both achieved. The value of (w3) may be changed by adjusting etching time. In the First Embodiment, (w3) is 5 μm and (w2) is 60 μm.

(3) Coating layer (38) with a thinner thickness than (w3) is formed on the side walls of the metal film and on the carrier (copper foil) exposed through openings of the metal film (FIG. 2(B)). The coating layer of the First Embodiment is electrolytic tin-plated film and is 3 μm thick. As for the coating layer, conductive film such as electroless plated film, electrolytic plated film or sputtered film may be listed. As for the metal to form the coating layer, tin, nickel, gold, silver, palladium, platinum, solder or the like may be listed. The coating layer may contain two or more layers of conductive film. If the coating layer is formed with two layers of conductive film, tin, solder or gold is used for the first conductive film formed on the carrier; and nickel or palladium is used for the second conductive film formed on the first conductive film. When the coating layer is formed with two layers of conductive film, a combination of tin and nickel, solder and nickel or gold and nickel is preferred for the first layer and second layer of conductive film in that order. If the coating layer is formed with three layers of conductive film, tin, solder or gold is used for the first conductive film formed on the carrier; palladium is used for the second conductive film formed on the first conductive film; and nickel is used for the third conductive film formed on the second conductive film.

(4) By electrolytic plating, the space formed by coating layer (38) and opening (32a) of etching resist (32) is filled with plated film, and pad (76) made of plated film is formed (FIG. 2(C)). In the present embodiment, such a pad is made of electrolytic copper-plated film and has an upper surface (first surface) and a lower surface (second surface) opposite the upper surface. The upper surface is the side where the coating layer is formed. The bottom is preferred to be flat. Also, the bottom may be lower than the etching resist. As for the method for forming pads, electrolytic copper plating is preferred. The coating layer and metal film (metal layer) as well as the carrier and the coating layer are preferred to be made of different metals. If the metal film and the carrier are made of the same metal, the carrier and the metal film may be removed simultaneously.

(5) Etching resist (32) is removed to expose part of pad (76) (FIG. 2(D)). Pad (76) is made up of portion (76B) with a larger outer shape and portion (76A) with a smaller outer shape.

(6) Resin insulation layer (50) is formed on the bottoms of pads (76) and on the metal film (FIG. 3(A)). Pads are partially embedded in the resin insulation layer. Portions of pads embedded in the resin insulation layer (the side wall and bottom) make contact with the resin insulation layer.

(7) Next, via openings (50a) reaching the pad bottoms are formed in resin insulation layer (50) using a CO2 gas laser (FIG. 3(B)).

(8) The surface of resin insulation layer (50), including the inner walls of via openings (50a), is roughened (not shown in the drawings). A catalyst is applied to the surface of the resin insulation layer (not shown in the drawings).

(9) Next, the substrate with the applied catalyst is immersed in an electroless plating solution to form electroless plated film (52) on the surface of resin insulation layer (50) including the inner walls of via openings (50a) (FIG. 3(C)). In the present embodiment, electroless plating is electroless copper plating and electroless plated film is electroless copper-plated film.

(10) Plating resist (54) is formed on electroless copper-plated film (52) (FIG. 4(A)).

(11) Then, electrolytic plated film (56) is formed in areas where plating resist (54) is not formed (FIG. 4(B)). In the present embodiment, electrolytic plating is electrolytic copper plating and electrolytic plated film is electrolytic copper-plated film.

(12) Plating resist (54) is removed. By etching away electroless plated film between portions of electrolytic plated film, independent conductive circuit (58) and via conductors (60) are formed (FIG. 4(C)). The conductive circuit and via conductors are made of electroless plated film and electrolytic plated film on the electroless plated film. Via conductors (first via conductors) connect pads and the conductive circuit (first conductive circuit). Then, a black oxide treatment is conducted to make the surface of conductive circuit (58) roughened (not shown in the drawings).

Figure 5:
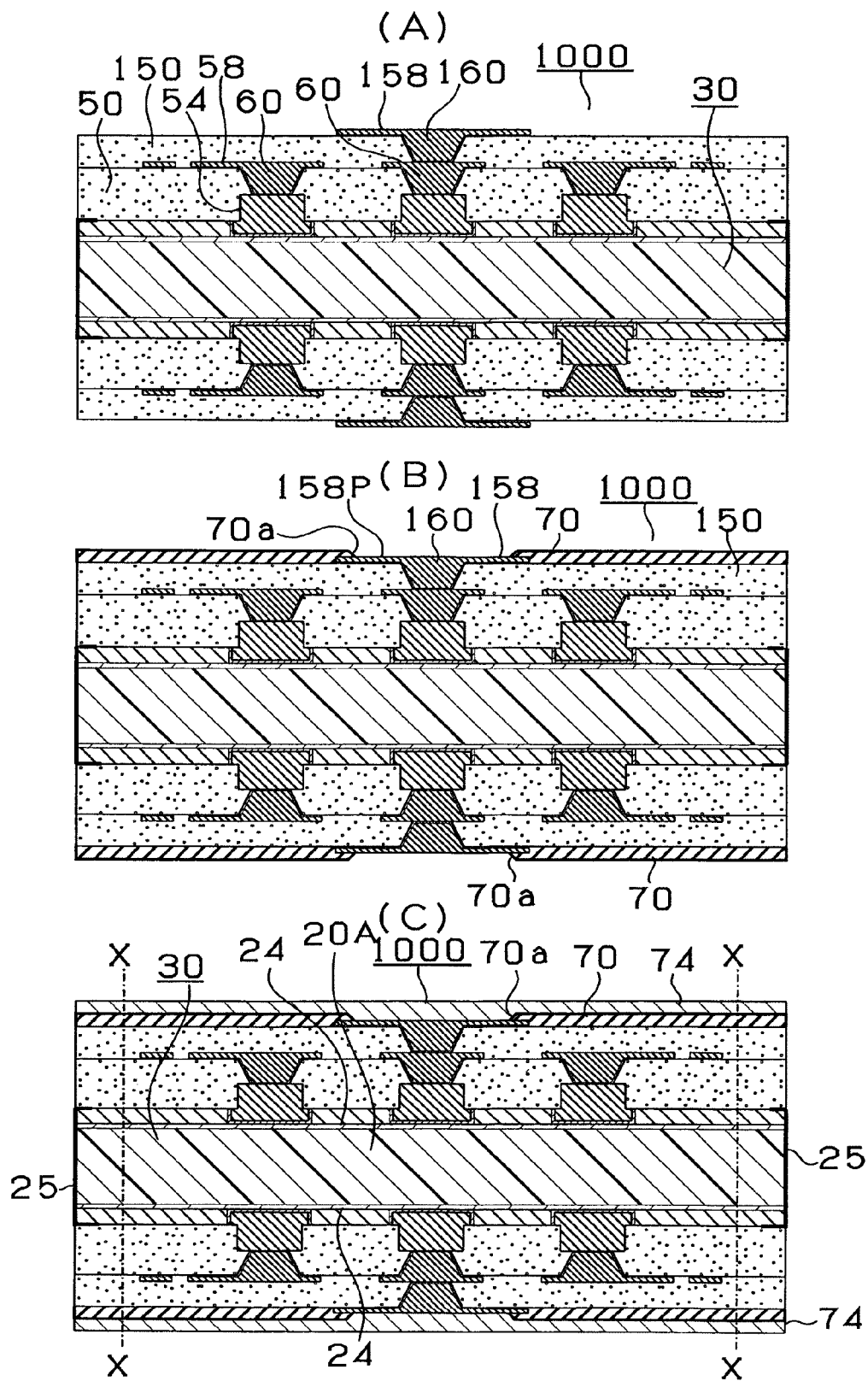
FIGS. 5A-5C are views showing the steps of a method for manufacturing a multilayer printed wiring board according to the First Example Embodiment.

(13) By repeating above steps (6)-(12), via conductors (second via conductors) (160) and resin insulation layer (lower resin insulation layer) (150) with conductive circuit (second conductive circuit) (158) are formed (FIG. 5(A)). By conducting steps up to (13), intermediate substrate (1000) is completed where two built-up layers are formed on carrier (30).

(14) Next, solder resist layer (70) having openings (70a) is formed on both surfaces of the intermediate substrate (FIG. 5(B)). The via conductors and conductive circuit exposed through openings (70a) become external connection terminals.

(15) Next, protective layer (74) is laminated on the substrate with solder resist layers (70). Before forming the protective layer, protective film made of nickel and gold may be formed on the surfaces of external connection terminals. Then, the edges of the intermediate substrate are cut at the X-X lines in the drawing (FIG. 5(C)). The positions to be cut are outside the product, but inside adhesive (25). After such cutting, upper-side and lower-side printed wiring boards (10) are separated from the carrier using removable layers (24) (FIG. 6(A)). The metal layer and coating layer are separated from the carrier using the removable layer.

(16) Metal film (26) is removed by etching, and the upper portions of pads (76) are exposed from the first surface of resin insulation layer (50) (FIG. 6(B)). Of pads (76), the portions protruding from resin insulation layer (50) become protruding portions (76B) and the portions embedded in resin insulation layer (50) become embedded portions (76A). When etching away the metal film, tin-plated film (38) on the surfaces of pads (76) made of copper functions as a stopper. If the metal film is copper and the coating layer is tin, "A-Process" made by Meltex Inc. may be used as an etchant. If the metal film is copper and the coating layer is nickel, "Mecbrite VE-7100" made by Mec Co., Ltd., may be used as an etchant. If the metal film is copper and the coating layer is gold or palladium, a copper chloride etching solution may be used as an etchant. In such a combination, the metal film may be removed by etching without substantially dissolving the coating layer. The coating layer formed on the first surfaces and the side walls of the protruding portions is preferred to be exposed.

(17) Then, protective layer (74) is removed and an OSP for rust prevention is applied to pads (158P) on the lower-surface side (FIG. 6(C); the OSP is not shown in the drawing). If protective film is formed on external connection terminals in step (15), an OSP is not required to be applied on external connection terminals. Solder balls made of tin and antimony are loaded on external connection terminals. By reflowing at 230° C., solder bumps (79) made of tin and antimony are formed on external connection terminals (158P) (FIG. 6(D)).

Figure 7:
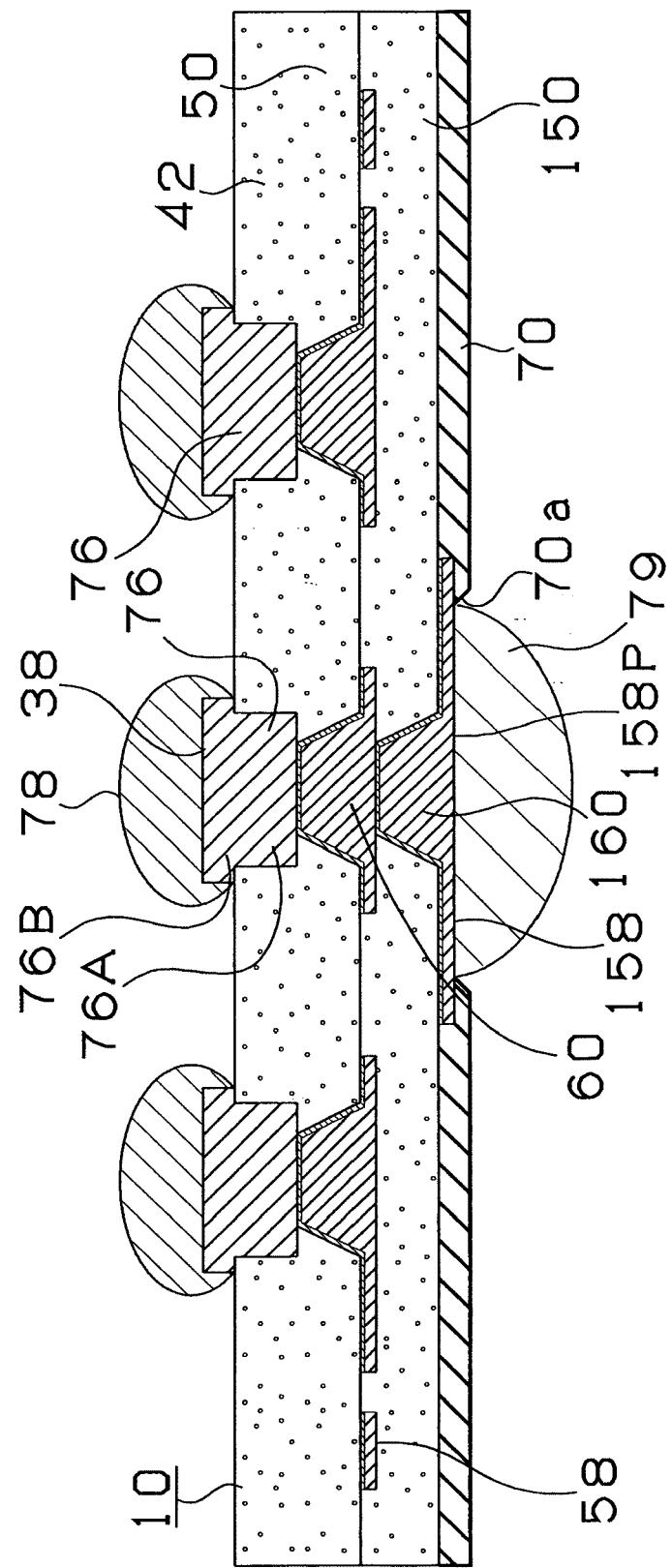
FIG. 7 is a cross-sectional view of a multilayer printed wiring board according to the First Example Embodiment.

(18) In the following, by printing tin-lead solder paste on the upper portion of pads (76) of the upper surface, and reflowing at 200° C., solder bumps (solder body) are formed on the pads. Accordingly, a multilayer printed wiring board with solder bumps (78) is complete (FIG. 7). Solder bumps (78) are preferred to be formed on the side walls and top surfaces of the protruding portions of pads. The first surface of resin insulation layer (50) is preferred to be exposed without forming solder resist on the first surface of resin insulation layer (50).

Figure 8:
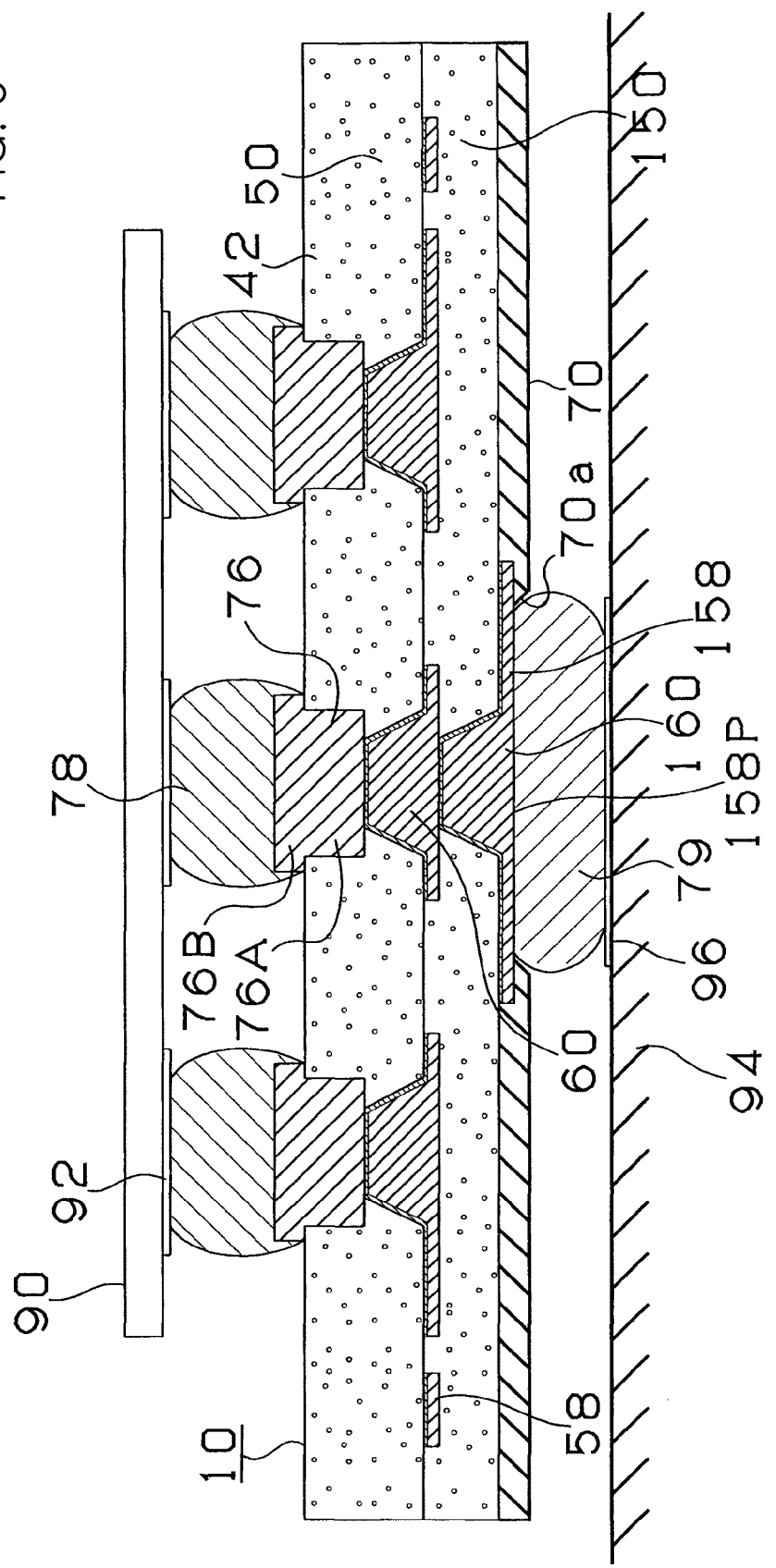
FIG. 8 is a cross-sectional view showing a state in which an IC chip is mounted on the multilayer printed wiring board of the First Example Embodiment.
Figure 9:
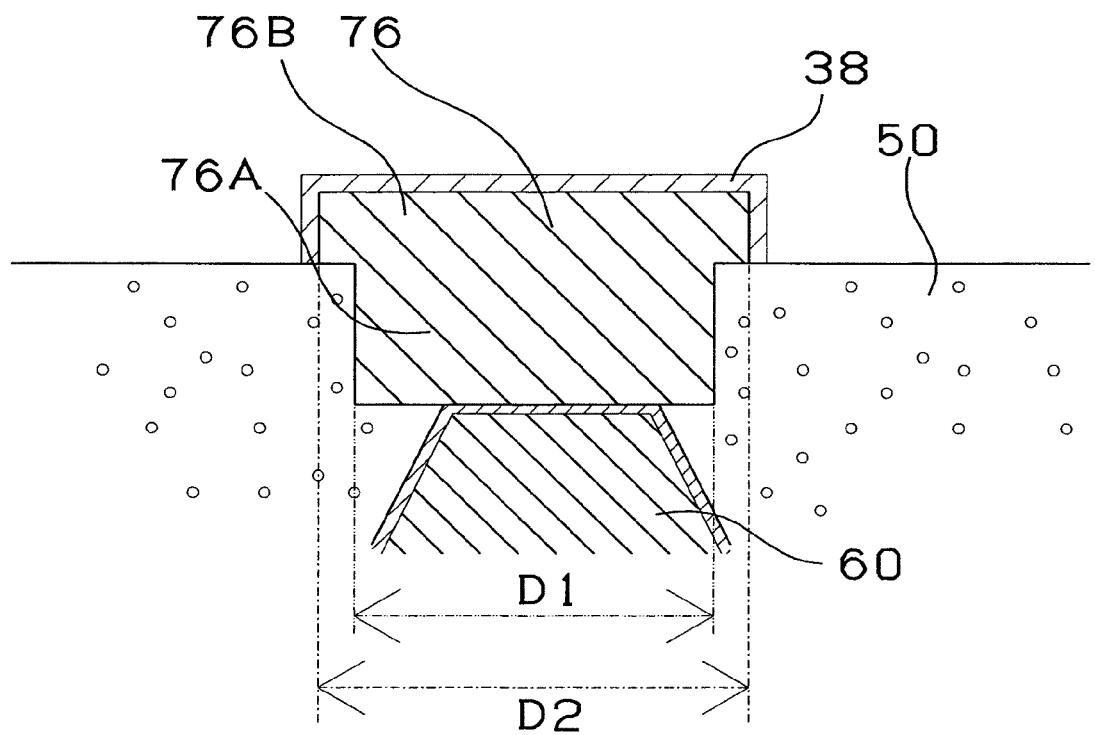
FIG. 9 is a magnified cross-sectional view of a pad of the multilayer printed wiring board shown in FIG. 7)

Electronic component (90) such as an IC chip is mounted by means of solder bumps (78) on pads. Then, the printed wiring board is mounted on motherboard (94) by means of solder bumps (79) on external connection terminals (FIG. 8).

Second Example Embodiment

A multilayer printed wiring board according to the Second Embodiment of the present invention is an example where the coating layer is made up of nickel film on pads and tin film on the nickel film.

In a multilayer printed wiring board of the Second Embodiment, a coating layer made of nickel-plated film (40) and tin-plated film (38) is formed on the surfaces of protruding portions (76B) of pads (76). Solder bumps are formed on the pads with nickel film in between. Since nickel has high corrosion resistance, connection reliability between solder bumps and pads remains high for a long duration. If pads are made of copper-plated film and solder bumps are made of tin, a copper-tin alloy may seldom be formed between the pads and the solder bumps, since the coating layer contains nickel film. As for tin solder bumps, tin bumps, Sn/Pb bumps, Sn/Ab bumps, Sn/Ag bumps, Sn/Ag/Cu bumps may be listed.

A method for manufacturing a multilayer printed wiring board of the Second Embodiment is described. In steps (1)-(3) of the First Embodiment, (w3) is set at 7 μm (FIG. 10(A)), and nickel-plated film is further formed on the tin-plated film. Tin-plated film and nickel-plated film are both electrolytic plated film. In the Second Embodiment, the coating layer is formed with two layers of conductive film (lower conductive film (38) and upper conductive film (39)). The thickness of nickel-plated film (39) is 3 μm and the thickness of tin-plated film (38) is 2 μm (FIG. 10(B)).

Then, the same as in the First Embodiment described by referring to FIG. 2(C), pads (76) are formed on the coating layer by electrolytic copper plating (FIG. 10(C)). Since the rest of the process is the same as in the First Embodiment described with reference to FIG. 2(D) and the subsequent drawings, its description is omitted here.

Third Example Embodiment

Figure 11:
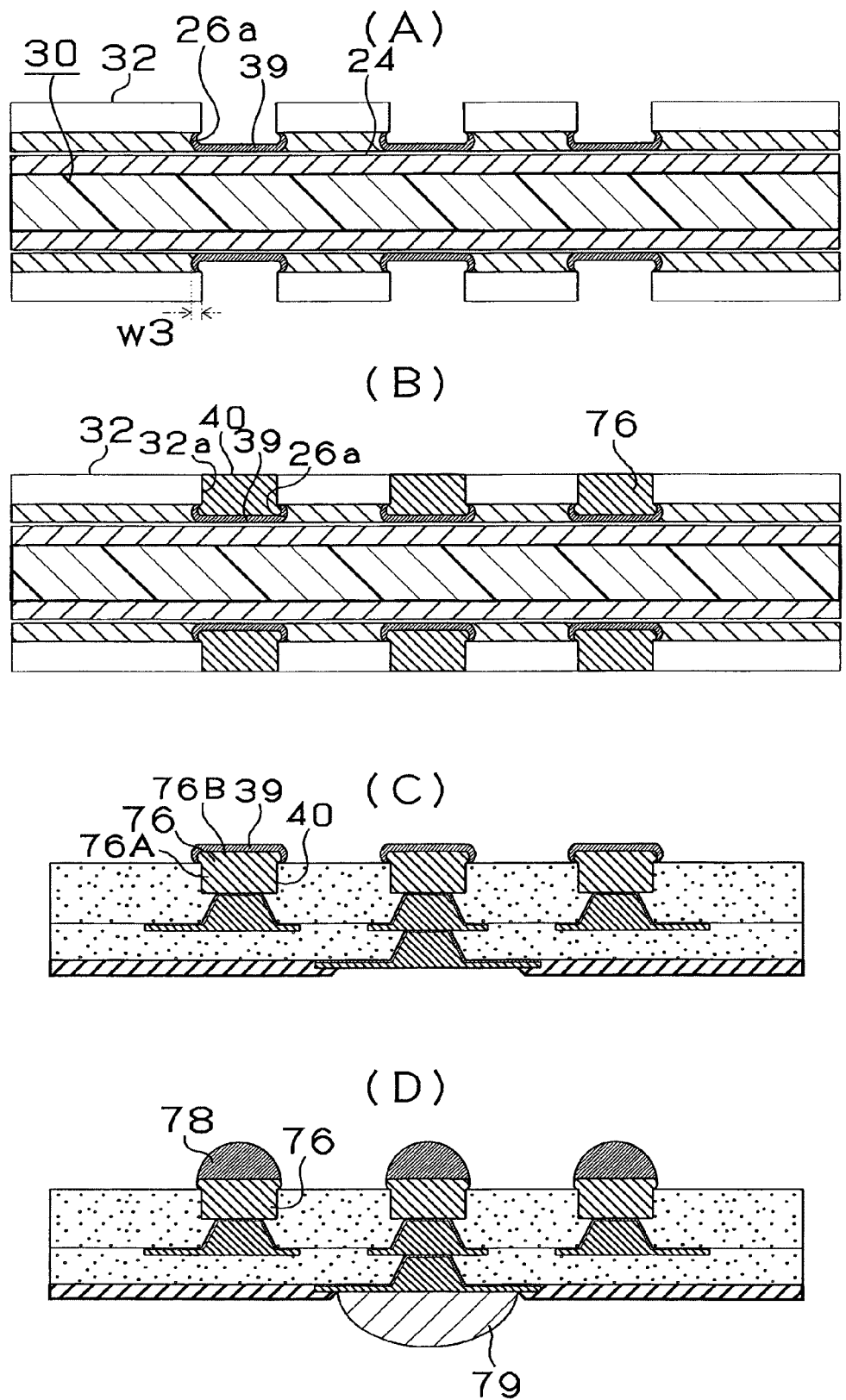
FIGS. 11A-11D are views showing the steps of a method for manufacturing a multilayer printed wiring board according to the Third Example Embodiment of the present invention.

A multilayer printed wiring board according to the Third Embodiment of the present invention is described with reference to FIG. 11). In the above-described First Embodiment, solder paste is printed on pads, and reflowed to form solder bumps. By contrast, in the Third Embodiment, as shown in FIG. 11(C), solder-plated film (39) is formed by plating on pads (76) and the solder-plated film is reflowed to form solder bumps (78) as shown in FIG. 11(D).

A method for manufacturing a multilayer printed wiring board of the Third Embodiment is described. In steps (1)-(3) of the First Embodiment, (w3) is set at 10 μm. Furthermore, the plated film formed on the side walls of the metal film and carrier (copper foil) exposed through the openings of the metal film is changed from electrolytic tin-plated film to electrolytic solder-plated film with a thickness of 7 μm (FIG. 11(A)).

Then, the same as in the First Embodiment described by referring to FIG. 2(C), pads (76) are formed on the solder-plated film by electrolytic copper plating (FIG. 11(B)). After that, following the same steps of the First Embodiment shown in FIGS. 2(D)-6(C), a printed wiring board is complete where bumps are formed on both surfaces (FIG. 11(D)). In the Third Embodiment, a step to print solder paste on pads is not required. Also, in the Third Embodiment, a coating layer made of nickel-plated film or the like may be formed between solder-plated film and pads.

Example 1

In the following, the present invention is further described by examples; however, the present invention is not limited to the scope of such examples. A method for manufacturing multilayer printed wiring board (10) of the present example is described with reference to FIGS. (12)-(19).

Figure 12:
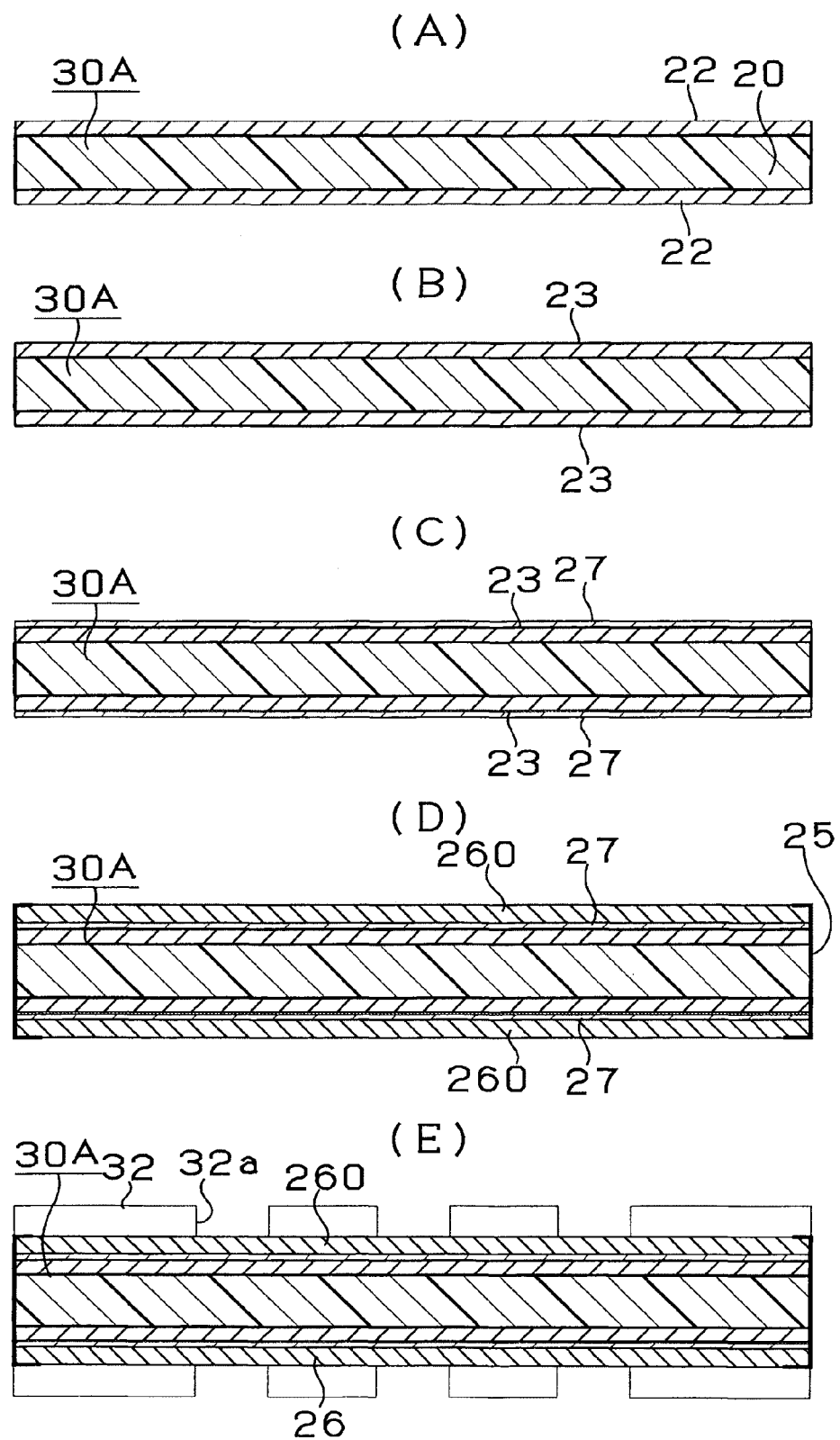
FIGS. 12A-12E are views showing the steps of a method for manufacturing a multilayer printed wiring board according to the First Example of the present invention.

(1) As a carrier, copper clad laminate (30A) with a thickness of 0.4 mm is prepared by laminating copper foils (22) on resin layer (20) (FIG. 12(A)). Carbon layer (23) (removable layer) with a thickness of 20 nm is formed by sputtering on the copper foil of copper clad laminate (30A) (FIG. 12(B)). Using the copper foil and the carbon layer as the seed, nickel-plated film with a thickness of 3 μm is formed by electrolytic plating to make it stopper layer (27) (FIG. 12(C)). Then, on nickel-plated film (27), copper-plated layer (metal layer) (260) with a thickness of 18 μm is formed by electrolytic plating. Then, epoxy adhesive (25) is applied to the edge surfaces of copper-plated layer (26) and copper-clad laminate (30A) to fix them to each other (FIG. 12(D)). A commercially available photosensitive dry film is laminated on the electrolytic copper-plated layer. Then, a mask is placed on the dry film, which is then exposed to light at 100 mJ/cm². After that, the dry film is developed using a 0.8% sodium carbonate solution to form etching resist (32), which has openings (32a) and is 15 μm thick (FIG. 12(E)).

(2) An etchant mainly containing copper (II) chloride is used to remove electrolytic copper-plated layer (260) located under openings (32a) of etching resist (32). Accordingly, the nickel-plated film on the removable layer is exposed. Because of the nickel-plated film, uniform etching depth may be achieved. During that time, portions of the electrolytic copper-plated layer which are contiguous to electrolytic copper-plated layer (260) exposed through opening (32a) of etching resist (32) and which are located under the etching resist are removed simultaneously (FIG. 13(A)). Electrolytic copper-plated film (26a) is formed as metal film under the etching resist. In the present example, (w3) is 18 μm.

Figure 13:
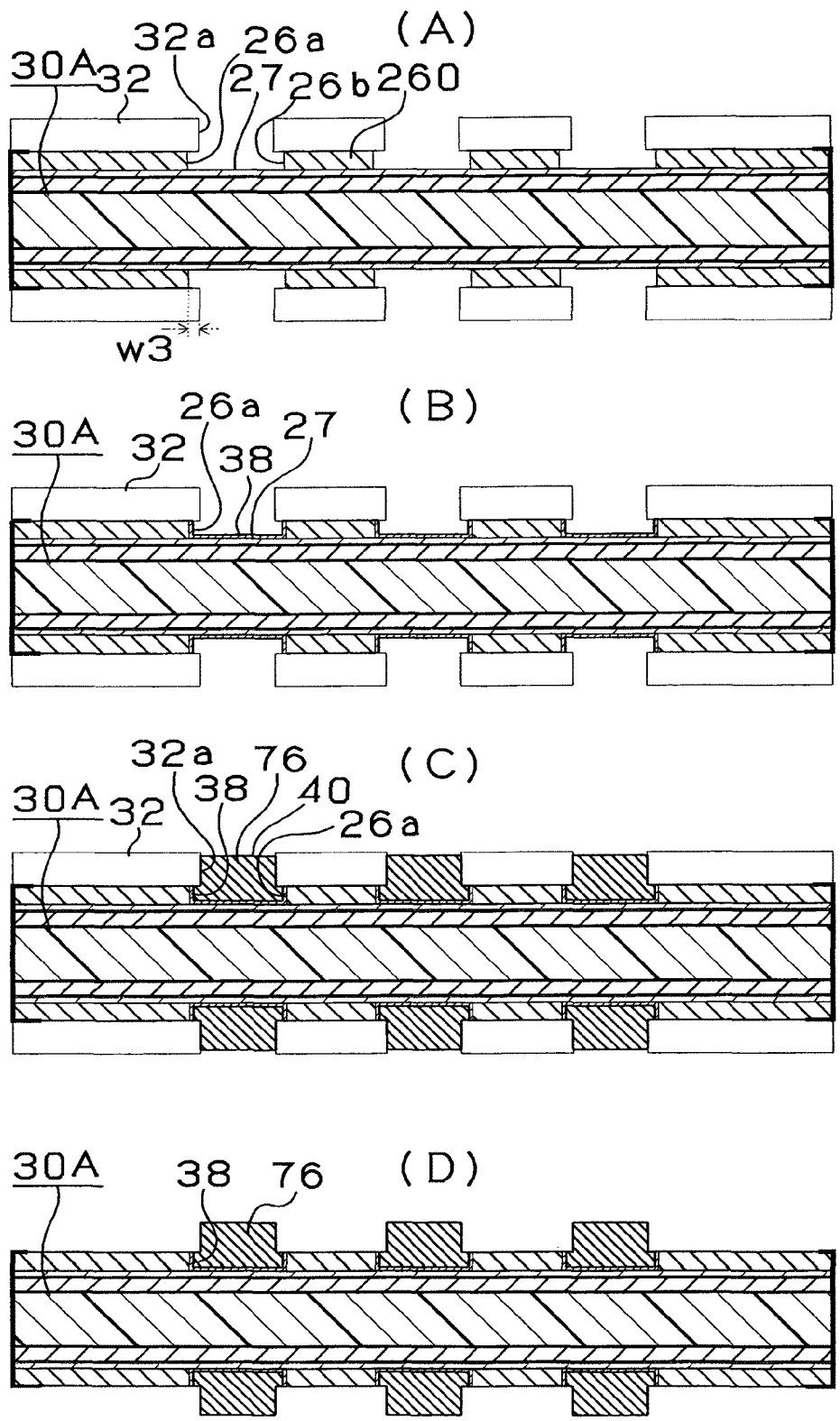
FIGS. 13A-13D are views showing the steps of a method for manufacturing a multilayer printed wiring board according to the First Example.

(3) By electrolytic tin plating, tin-plated film (38) is formed on exposed nickel-plated film (27) and side walls of metal film (26a) (FIG. 13(B)). Tin-plated film (38) is 3 μm thick and functions as a coating layer.

(4) By electrolytic copper plating, pads (76), whose bottom surfaces (second surfaces) are flat, are formed on the tin-plated film (FIG. 13(C)).

(5) Etching resist (32) is removed by a 5% KOH solution and pads (76) are partially exposed (FIG. 13(D)). The bottoms of the pads, and the side walls of the pads that are not covered by the coating layer are exposed.

(6) Resin film for resin insulation layers (brand name: ABF-45SH, made by Ajinomoto) is laminated on pads (76) and metal film (26a) under the conditions of vacuum degree 67 Pa, pressure 0.47 MPa, temperature 85° C. and pressing time 60 seconds. After that, by thermosetting the resin film for resin insulation layers at 170° C. for 40 minutes, resin insulation layer (50) having a first surface and a second surface opposite the first surface is formed (FIG. 14(A)). The first surface is the surface facing metal film (26a).

(7) Next, via openings (50a) reaching the pad bottoms are formed in resin insulation layer (50) using a CO2 gas laser (FIG. 14(B)).

(8) The substrate with via openings (50a) is immersed in an 80° C. solution containing permanganic acid 60 g/l for 10 minutes to remove particles residing on the surface of resin insulation layer (50). The surface of resin insulation layer (50) including the inner walls of via openings (50a) are roughened (not shown in the drawings).

(9) Next, the substrate with an applied catalyst is immersed in an electroless copper-plating solution (Thru-Cup PEA) made by C. Uyemura & Co., Ltd. to form an electroless copper-plated film with a thickness of 0.3-3.0 μm on the entire roughened surface. Accordingly, the substrate is obtained where electroless copper-plated film (52) is formed on the surface of resin insulation layer (50) including the inner walls of via openings (50a) (FIG. 14(C)).

[Electroless Plating Conditions]
solution temperature of 34° C. for 45 minutes

(10) A commercially available photosensitive dry film is laminated on the substrate with electroless copper-plated film (52). A mask is placed on the dry film and exposed to light at 110 mJ/cm$^2$, which is then developed by a 0.8% sodium carbonate solution. Accordingly, plating resist (54) with a thickness of 25 μm is formed on electroless copper-plated film (52) (FIG. 15(A)).

(11) Then, the substrate is cleansed with 50° C. water to degrease, and washed with 25° C. water, and further cleansed with sulfuric acid. After that, electrolytic plating is performed under the following conditions to form electrolytic copper-plated film (56) with a thickness of 15 μm in areas where plating resist (54) is not formed (FIG. 15(B)).

| [electrolytic plating solution] | |
|---|---|
| sulfuric acid | 2.24 mol/l |
| copper sulfate | 0.26 mol/l |
| additive (Cupracid GL, made by Atotech Japan) | 19.5 ml/l |
| [electrolytic plating conditions] | |
| current density | 1 A/dm$^2$ |
| time | 70 minutes |
| temperature | 22 ± 2° C. |

(12) Furthermore, plating resist (54) is removed by a 5% KOH solution. After that, by etching away electroless plated film between portions of electrolytic copper-plated film using a mixed solution of sulfuric acid and hydrogen peroxide, independent conductive circuit (58) and via conductors (60) are formed (FIG. 15(C)). Then, a black oxide treatment is conducted using a solution containing NaOH (10 g/l), NaClO2 (40 g/l) and Na3PO4 (6 g/l) as a black-oxide bath (oxidation bath), followed by a reduction treatment using a solution containing NaOH (10 g/l) and NaBH4 (6 g/l) as a reduction bath. Accordingly, the surfaces of conductive circuit (58) and via conductors (60) are roughened (not shown in the drawings).

Figure 16:
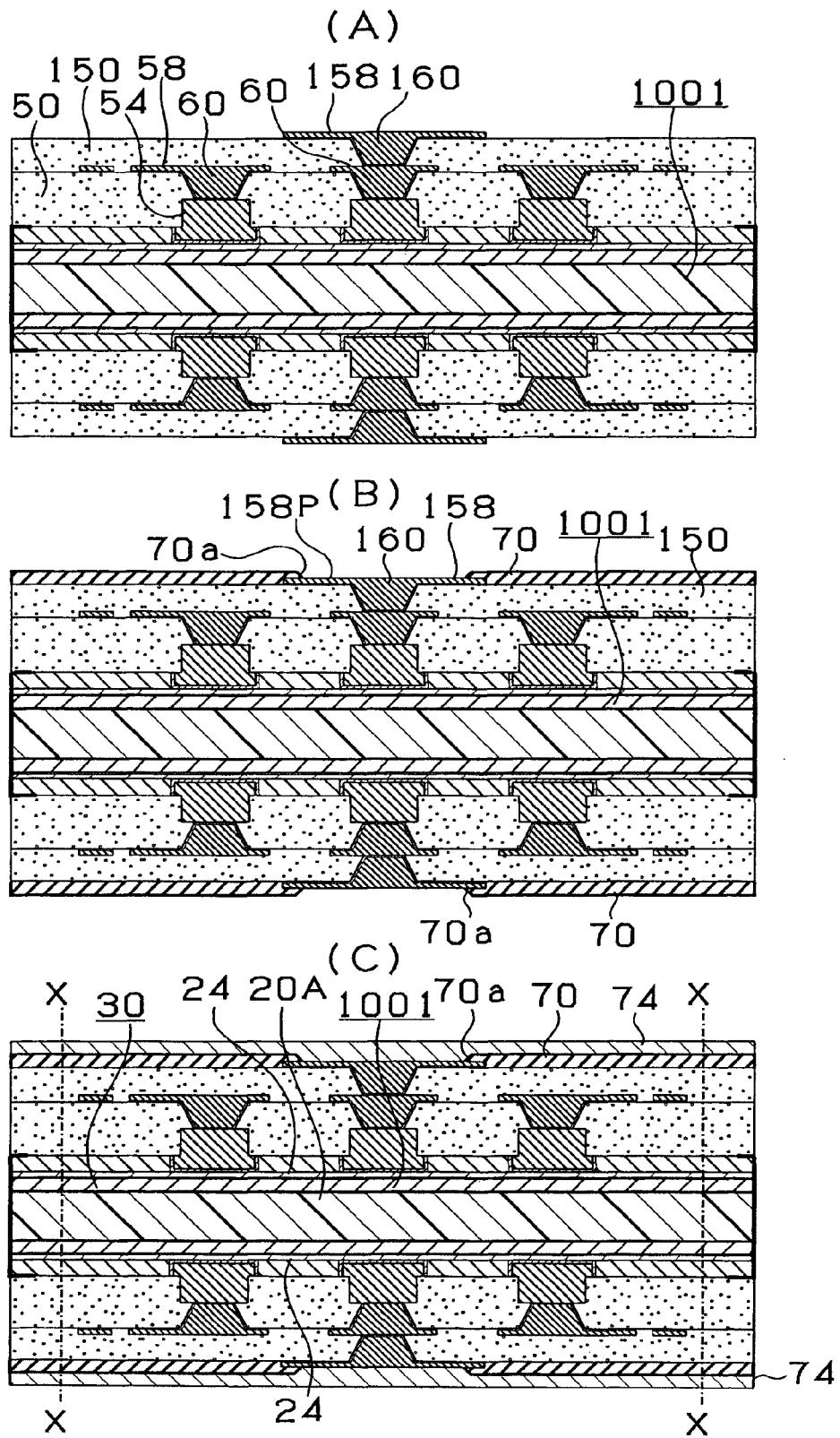
FIGS. 16A-16C are views showing the steps of a method for manufacturing a multilayer printed wiring board according to the First Example.

(13) By repeating above steps (6)-(12), resin insulation layer (150) is built up having via conductors (160) and conductive circuit (158) (FIG. 16(A)). Intermediate substrate (1001) is obtained.

(14) Next, on both surfaces of intermediate substrate (1001), solder resist layer with openings (70a) is formed to have a thickness of 15-25 μm (FIG. 16(B)).

(15) Next, protective layer (74) is formed on the substrate with solder resist layer (70). Then, the edges of the intermediate substrate having solder resist layers are cut along the (X-X) line in the drawing (FIG. 16(C)). Printed wiring boards (10) on the upper side and lower side are separated from carrier (30A) using removable layers (24) (FIG. 17(A)).

(17) The nickel-plated film as stopper layer (27) is removed using "NH 1860 series" made by Mec Co., Ltd. In the following, using "A-Process" made by Meltex Inc., electrolytic copper-plated film (26a) as metal film is removed. Accordingly, the upper portions of pads (76) are exposed from resin insulation layer (50) (FIG. 17(B)): The portions protruding from resin insulation layer (50) become protruding portions (76B) and the portions embedded in resin insulation layer (50) become embedded portions (76A). During that time, since tin-plated film (38) on the surfaces of pads (76) made of copper functions as a stopper, the pads are not substantially dissolved in an etchant.

Figure 17:
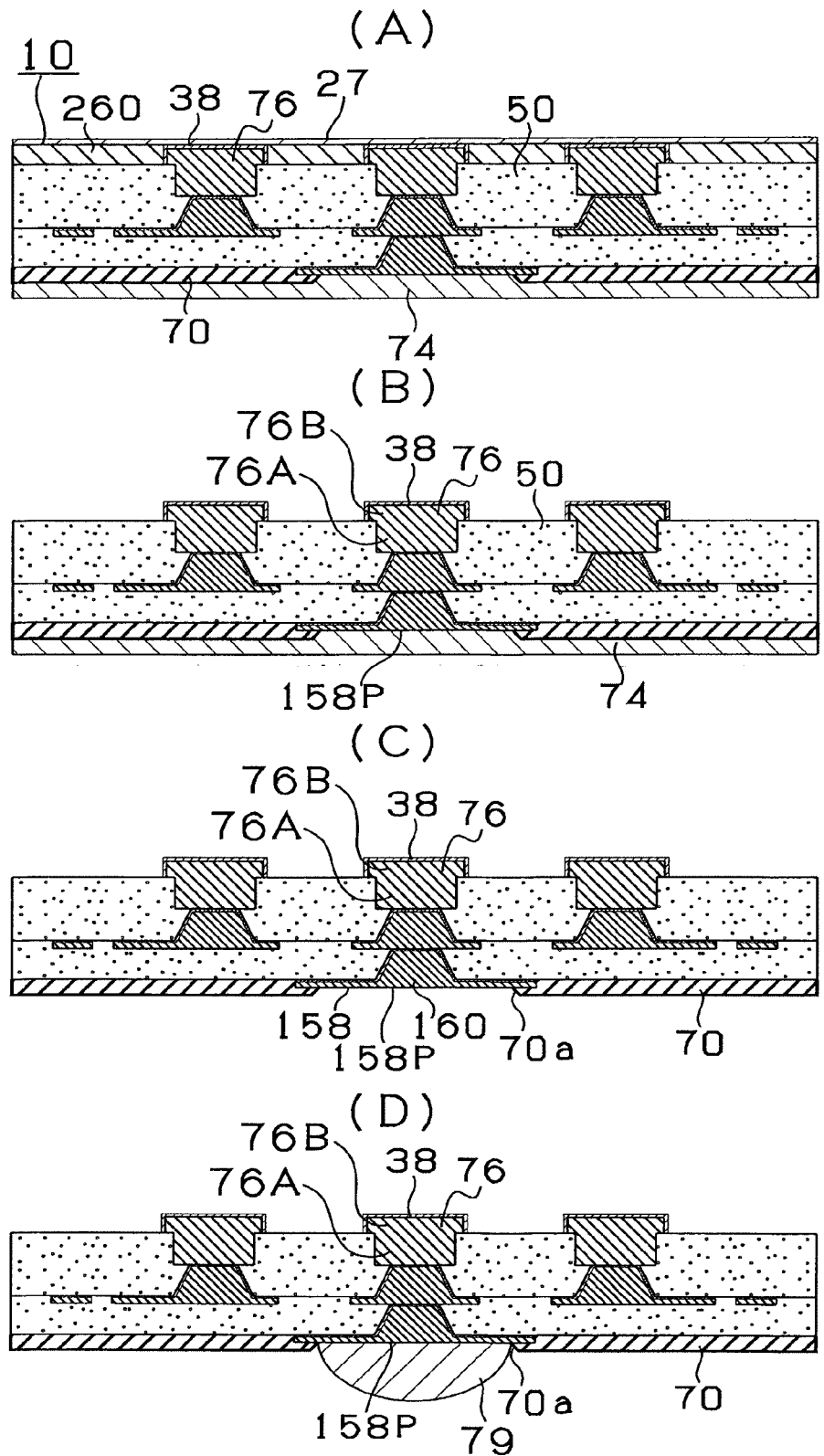
FIGS. 17A-17D are views showing the steps of a method for manufacturing a multilayer printed wiring board according to the First Example.

(18) After that, protective layer (74) is removed and an OSP for rust prevention is applied on pads (external connection terminals) (158P) on the lower-surface side (FIG. 17(C), the OSP is not shown in the drawing). By loading solder balls made of tin and antimony on external connection terminals and reflowing them at 230° C., solder bumps (79) made of tin and antimony are formed on external connection terminals (158P) (FIG. 17(D)).

Figure 18:
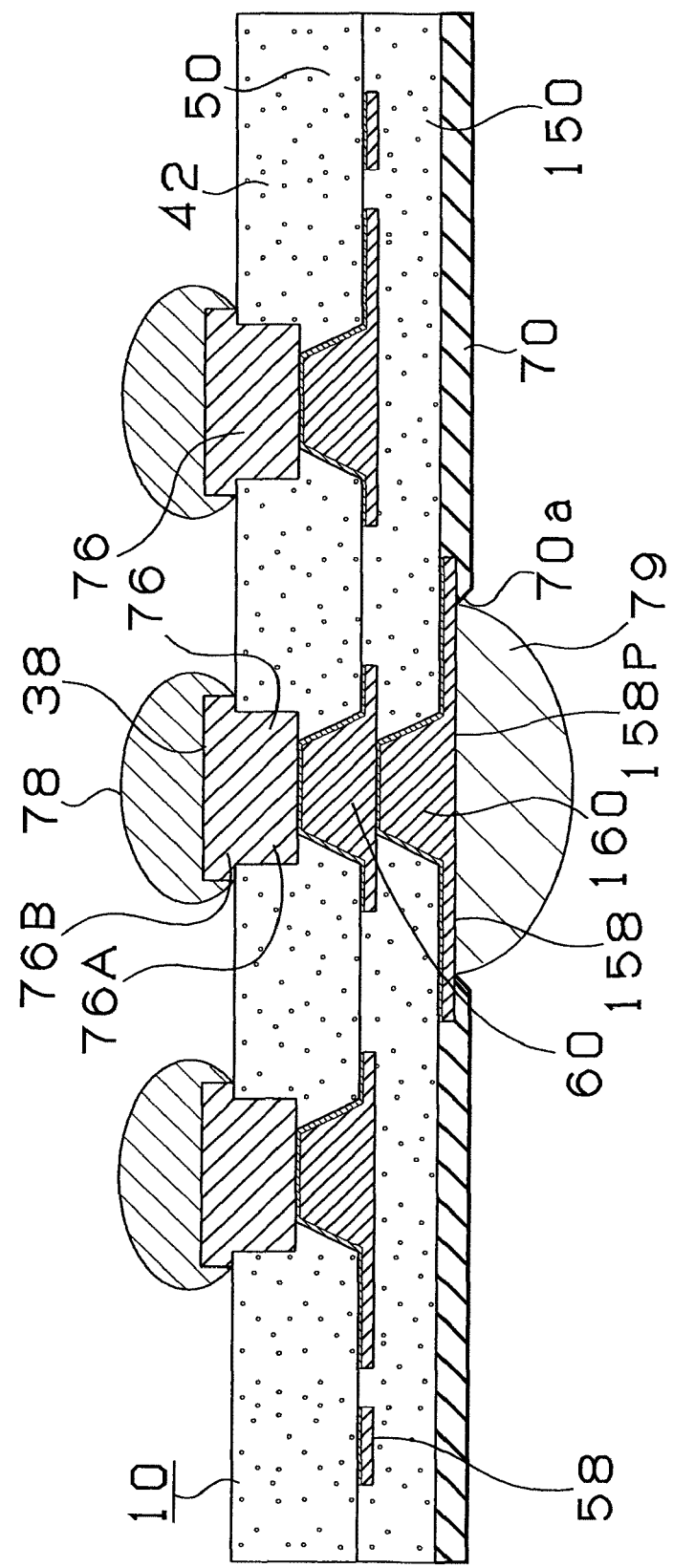
FIG. 18 is a cross-sectional view showing a multilayer printed wiring board according to the First Example.

(19) In the following, tin-lead solder paste is printed on the upper portions of pads (76) on the upper surface. Then, by reflowing at 200° C., solder bumps (solder body) are formed on the pads. Accordingly, a multilayer printed wiring board with solder bumps (78) is completed (FIG. 18). Here, instead of tin-lead solder, tin-antimony or tin-silver solder may also be used. Simultaneously, when printing solder paste on upper-surface pads (76), tin-antimony solder paste is printed on openings (70a) of solder resist layer (70) on the lower surface, and reflowed at 230° C. to form solder bumps (solder body). Accordingly, a multilayer printed wiring board may be manufactured to have bumps on its upper and lower surfaces.

Figure 19:
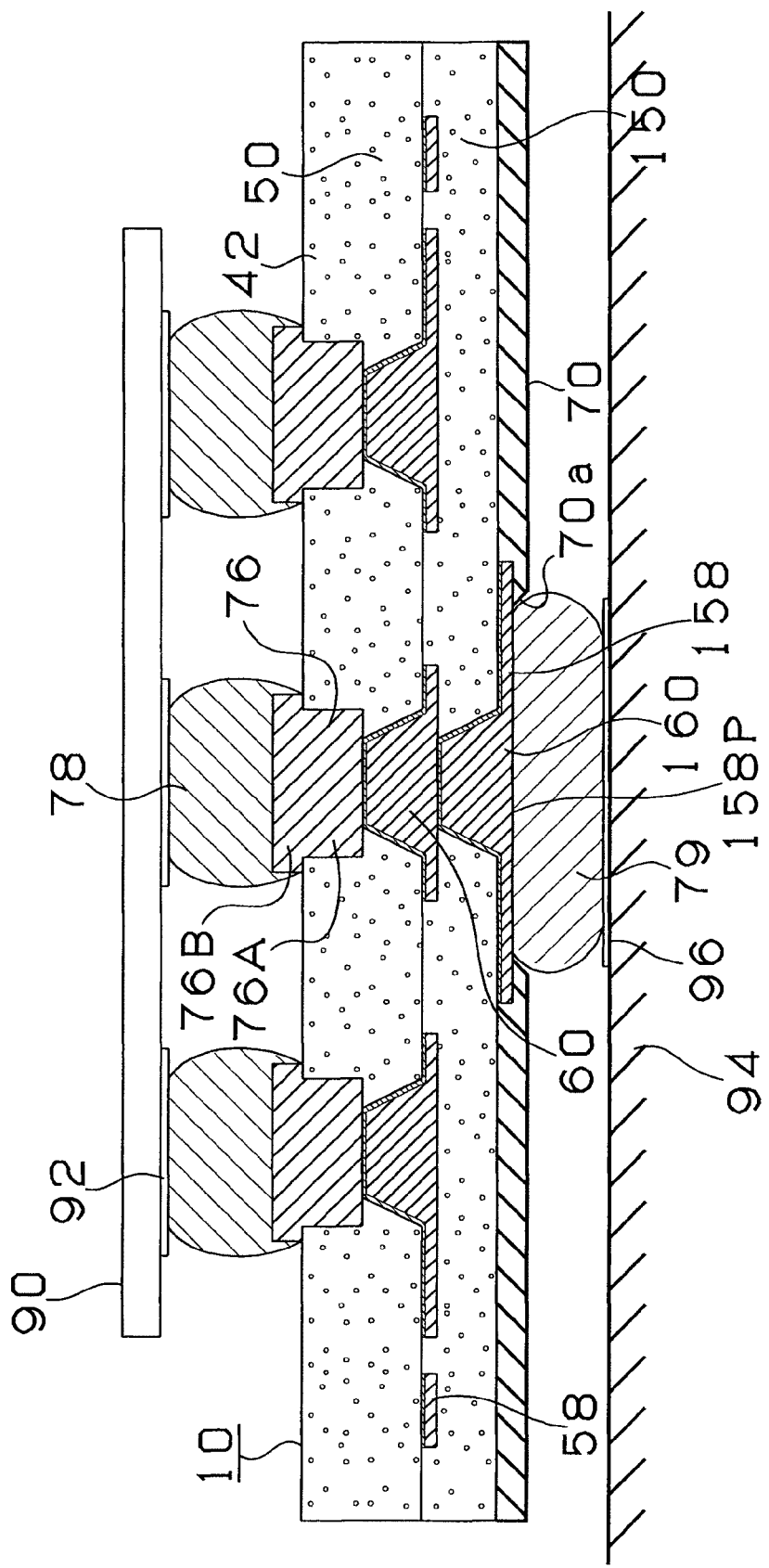
FIG. 19 is a cross-sectional view showing a state in which an IC chip is mounted on the multilayer printed wiring board of the First Example.

IC chip (90) is mounted on the wiring board by means of solder bumps (78) on the upper surface, and the wiring board is mounted on daughterboard (94) by means of solder bumps (79) on the lower surface (FIG. 19).

Example 2

Example (2) is the same as Example (1) except for the following. In Example (2), a stopper layer is not formed. Instead, metal layer (260) made of 18 μm-thick electrolytic copper plating is formed on the removable layer. Thus, in step (17) of Example (1), a step to remove the stopper layer is not required. Also, the removable layer is not a carbon layer, but a layer of nickel-plated film.

In the above embodiments, examples are listed in which the pad structure of the present invention is employed in a built-up multilayer wiring board without a core substrate. However, the pad structure of the present invention may be employed in various printed wiring boards.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a resin insulation layer having a first surface and a second surface on an opposite side of the first surface;
a first conductive circuit formed on the second surface of the resin insulation layer;
an electronic-component mounting pad structure comprising an embedded portion embedded in the resin insula- tion layer and a protruding portion protruding from the first surface of the resin insulation layer; and a first via conductor formed in the resin insulation layer and connecting the first conductive circuit on the second surface of the resin insulation layer and the embedded portion of the electronic-component mounting pad structure, wherein the protruding portion of the electronic-component mounting pad structure has a diameter which is larger than a diameter of the embedded portion of the electronic-component mounting pad structure, and the diameter of the embedded portion of the electronic-component mounting pad structure is larger than a surface of the first via conductor in contact with the embedded portion of the electronic-component mounting pad structure.

2. The printed wiring board according to claim 1, further comprising:

a lower resin insulation layer which is arranged beneath the second surface of the resin insulation layer, and which has a first surface and a second surface on an opposite side of the first surface;

a second conductive circuit formed on the second surface of the lower resin insulation layer; and a second via conductor formed in the lower resin insulation layer and connecting the first conductive circuit and the second conductive circuit or connecting the first via conductor and the second conductive circuit, wherein the second conductive circuit or the second via conductor has a portion which is an external connection terminal for connection with an external substrate.

3. The printed wiring board according to claim 1, further comprising a coating layer made of plating formed on a surface of the protruding portion.

4. The printed wiring board according to claim 3, wherein the coating layer is made of a tin-plated layer.

5. The printed wiring board according to claim 3, wherein the coating layer is made of a nickel-plated layer on the electronic-component mounting pad structure and a tin-plated layer on the nickel-plated layer.

6. The printed wiring board according to claim 1, further comprising a solder bump formed on the electronic-component mounting pad structure.

7. The printed wiring board according to claim 1, wherein the protruding portion and the embedded portion are directly connected.

8. The printed wiring board according to claim 3, wherein the coating layer is formed on a top and side surfaces of the protruding portion.

9. The printed wiring board according to claim 1, wherein the first surface of the resin insulation layer is exposed.

10. The printed wiring board according to claim 1, wherein the electronic-component mounting pad structure is formed in a pad-forming region, and the first surface of the resin insulation layer except for the pad-forming region is exposed.

* * * * *